(12) United States Patent
Ohse

(10) Patent No.: US 12,733,227 B2
(45) Date of Patent: Sep. 8, 2026

(54) SILICON CARBIDE SEMICONDUCTOR DEVICE AND METHOD OF MANUFACTURING THE SAME

(71) Applicant: FUJI ELECTRIC CO., LTD., Kawasaki (JP)

(72) Inventor: Naoyuki Ohse, Matsumoto-city (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 386 days.

(21) Appl. No.: 18/429,602

(22) Filed: Feb. 1, 2024

(65) Prior Publication Data

US 2024/0332363 A1 Oct. 3, 2024

(30) Foreign Application Priority Data

Mar. 29, 2023 (JP) ................................ 2023-053842

(51) Int. Cl.

| | |
|---|---|
| ***H10D 62/832*** | (2025.01) |
| ***H10D 12/01*** | (2025.01) |
| ***H10D 30/01*** | (2025.01) |
| ***H10D 30/66*** | (2025.01) |
| ***H10D 62/13*** | (2025.01) |
| ***H10D 64/27*** | (2025.01) |

(52) U.S. Cl.

CPC ....... *H10D 62/8325* (2025.01); *H10D 12/031* (2025.01); *H10D 30/0297* (2025.01); *H10D 30/668* (2025.01); *H10D 62/153* (2025.01); *H10D 64/513* (2025.01)

(58) Field of Classification Search

CPC ............ H10D 30/0297; H10D 30/668; H10D 64/513; H10D 62/8325

See application file for complete search history.

(56) References Cited

U.S. PATENT DOCUMENTS

| | | | | |
|---|---|---|---|---|
| 2013/0062622 | A1* | 3/2013 | Tsuchiya | H10D 12/421 257/E21.409 |
| 2017/0077299 | A1* | 3/2017 | Shimizu | H10D 30/63 |
| 2018/0358445 | A1* | 12/2018 | Kobayashi | H10D 12/031 |
| 2021/0005744 | A1* | 1/2021 | Ebihara | H10D 30/668 |

FOREIGN PATENT DOCUMENTS

| | | | | |
|---|---|---|---|---|
| JP | 2009-49198 | A | 3/2009 | |
| WO | 2017/042963 | A1 | 3/2017 | |
| WO | WO-2024070021 | A1 * | 4/2024 | H10D 62/393 |

OTHER PUBLICATIONS

Machine translation of WO-2024070021-A1 (Year: 2024).*

* cited by examiner

*Primary Examiner* — Erik Kielin

(57) ABSTRACT

A silicon carbide semiconductor device includes: a drift layer of a first conductivity-type; a base region of a second conductivity-type provided on a top surface side of the drift layer; a source contact region of the first conductivity-type including silicon carbide having a 3C-structure provided on a top surface side of the base region; a gate electrode buried inside a gate trench with a gate insulating film interposed; a main electrode buried inside a contact trench so as to be in contact with a side surface of the source contact region; and a base contact region of the second conductivity-type including silicon carbide having a 4H-structure so as to be in contact with a bottom surface of the contact trench, wherein the bottom surface of the contact trench is located at a position deeper than a bottom surface of the source contact region.

20 Claims, 22 Drawing Sheets

SILICON CARBIDE SEMICONDUCTOR DEVICE AND METHOD OF MANUFACTURING THE SAME

CROSS-REFERENCE TO RELATED APPLICATION

This application claims benefit of priority under 35 USC 119 based on Japanese Patent Application No. 2023-053842 filed on Mar. 29, 2023, the entire contents of which are incorporated by reference herein.

BACKGROUND OF THE INVENTION

1. Field of the Invention

The present invention relates to silicon carbide semiconductor devices and methods of manufacturing the same.

2. Description of the Related Art

JP 2009-049198 A discloses a semiconductor device including an amorphous layer obtained by implantation of impurity ions into a silicon carbide substrate of hexagonal single crystals, and an electrode obtained such that the amorphous layer is subjected to annealing to be recrystallized into n-type silicon carbide of cubic single crystals so as to vapor-deposit nickel on the top surface of the n-type silicon carbide.

WO 2017/042963 A1 discloses a semiconductor device including an $n^-$-type epitaxially-grown layer grown on a first main surface of an $n^+$-type SiC substrate including 4H-SiC, an $n^+$-type source region formed in the $n^-$-type epitaxially-grown layer, and an $n^+$-type 3C-SiC region and a $p^+$-type potential fixing region each formed in the $n^+$-type source region, in which a barrier metal film is formed in contact with the $n^+$-type 3C-SiC region and the $p^+$-type potential fixing region, and a source wiring electrode is further formed on the barrier metal film.

A study of trench-gate silicon carbide semiconductor devices has been promoted that have a configuration in which a source region (a main region) includes 3C-SiC so as to be in ohmic contact with a source electrode (a main electrode). Such a trench-gate silicon carbide semiconductor device can be rationally manufactured such that a conductivity of a part of the $n^+$-type source region is inverted (turned back) by implantation of p-type impurity ions by use of a mask after the source region is formed on the entire surface by implantation of n-type impurity ions so as to form a base contact region of $p^+$-type.

This manufacturing method, however, tends to cause a lot of damage to the turned-back part of the source region, leading to a leakage defect accordingly.

SUMMARY OF THE INVENTION

In view of the foregoing problems, the present invention provides a trench-gate silicon carbide semiconductor device having a configuration capable of leading a main region to be in ohmic contact with a main electrode without interposition of a silicide layer and further avoiding a leakage defect, and also provides a method of manufacturing the silicon carbide semiconductor device.

An aspect of the present invention inheres in a silicon carbide semiconductor device including: a drift layer of a first conductivity-type including silicon carbide; a base region of a second conductivity-type including silicon carbide provided on a top surface side of the drift layer; a source contact region of the first conductivity-type including silicon carbide having a 3C-structure provided on a top surface side of the base region; a gate insulating film deposited inside a gate trench penetrating the source contact region and the base region; a gate electrode buried inside the gate trench with the gate insulating film interposed; a main electrode buried inside a contact trench provided separately from the gate trench so as to be in contact with at least a side surface of the source contact region; and a base contact region of the second conductivity-type including silicon carbide having a 4H-structure and having a higher impurity concentration than the base region so as to be in contact with a bottom surface of the contact trench, wherein the bottom surface of the contact trench is located at a position deeper than a bottom surface of the source contact region.

Another aspect of the present invention inheres in a method of manufacturing a silicon carbide semiconductor device, the method including: forming a base region of a second conductivity-type including silicon carbide on a top surface side of a drift layer of a first conductivity-type including silicon carbide; forming a source contact region of the first conductivity-type including silicon carbide having a 3C-structure on a top surface side of the base region; forming a gate trench so as to penetrate the source contact region and the base region; depositing a gate electrode inside the gate trench with a gate insulating film interposed; forming a contact trench separately from the gate trench so as to penetrate the source contact region; depositing a main electrode inside the contact trench so as to be in contact with at least a side surface of the source contact region; and forming a base contact region of the second conductivity-type including silicon carbide having a 4H-structure and having a higher impurity concentration than the base region so as to be in contact with a bottom surface of the contact trench, wherein the contact trench is formed to have the bottom surface located at a position deeper than a bottom surface of the source contact region.

BRIEF DESCRIPTION OF THE DRAWINGS

FIG. 1 is a schematic cross-sectional view illustrating an example of a silicon carbide semiconductor device according to a first embodiment;

FIG. 7 is a schematic cross-sectional view continued from FIG. 6, for explaining the example of the method of manufacturing the silicon carbide semiconductor device according to the first embodiment;

FIG. 8 is a schematic cross-sectional view continued from FIG. 7, for explaining the example of the method of manufacturing the silicon carbide semiconductor device according to the first embodiment;

FIG. 19 is a schematic cross-sectional view continued from FIG. 18, for explaining the example of the method of manufacturing the silicon carbide semiconductor device according to the second embodiment;

DETAILED DESCRIPTION

Figure 2:
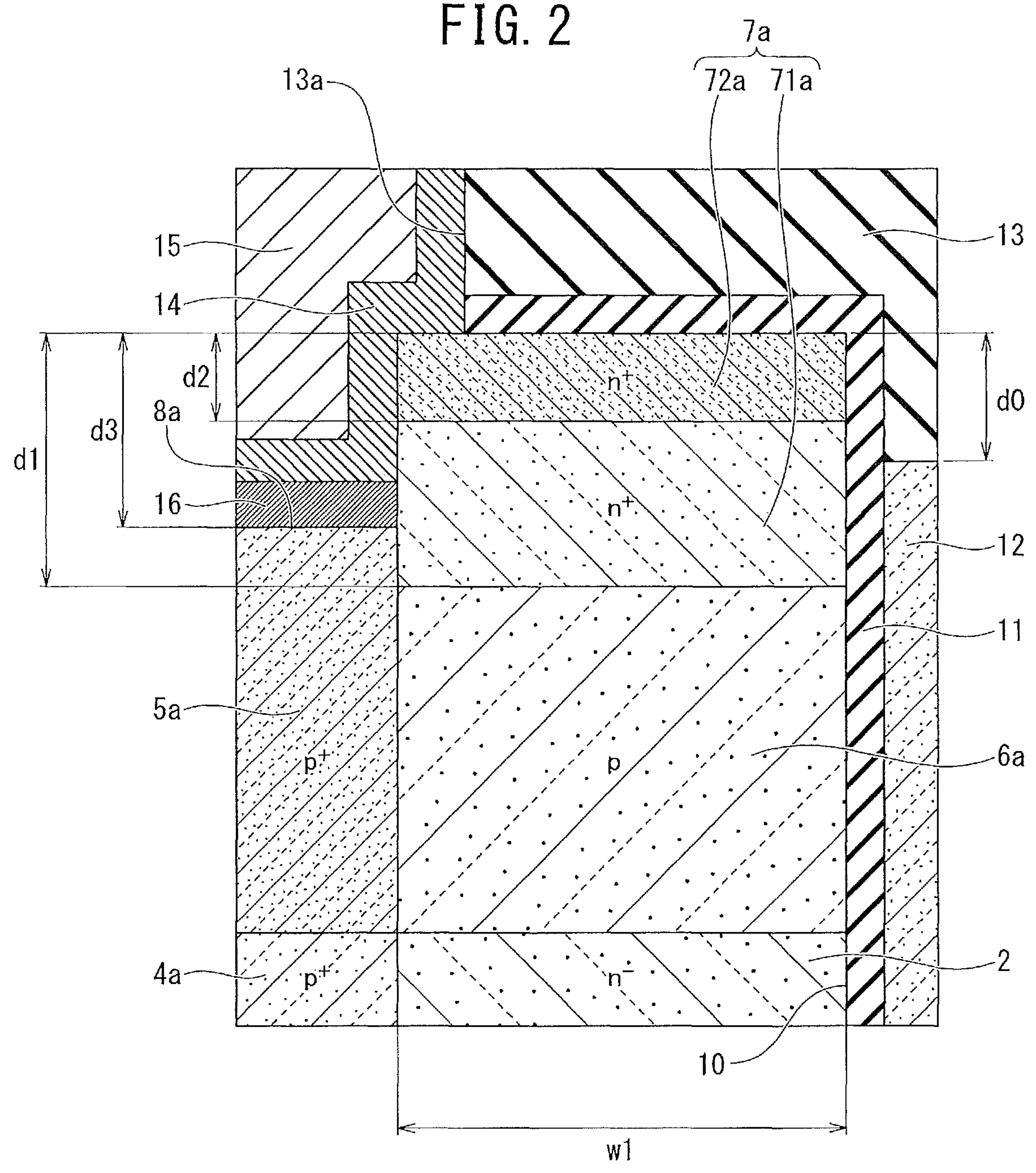
FIG. 2 is a schematic enlarged cross-sectional view of region A in FIG. 1.

With reference to the drawings, first to fifth embodiments of the present invention will be described below.

In the drawings, the same or similar elements are indicated by the same or similar reference numerals, and overlapping explanations are not repeated. The drawings are schematic, and it should be noted that the relationship between thickness and planer dimensions, the thickness proportion of each layer, and the like are different from real ones. Accordingly, specific thicknesses or dimensions should be determined with reference to the following description. Moreover, in some drawings, portions are illustrated with different dimensional relationships and proportions. The first to fifth embodiments described below merely illustrate schematically devices and methods for specifying and giving shapes to the technical idea of the present invention, and the span of the technical idea is not limited to materials, shapes, structures, and relative positions of elements described herein.

As used in the present specification, a source region of a metal-oxide-semiconductor field-effect transistor (MOSFET) is referred to as "one of the main regions (a first main region)" that can be used as an emitter region of an insulated gate bipolar transistor (IGBT). The "one of the main regions", when provided in a thyristor such as a MOS controlled static induction thyristor (SI thyristor), can be used as a cathode region. A drain region of the MOS transistor is referred to as the "other one of the main regions (a second main region)" of the semiconductor device that can be used as a collector region in the IGBT or as an anode region in the thyristor. The term "main region", when simply mentioned in the present specification, is referred to as either the first main region or the second main region that is determined as appropriate by the person skilled in the art.

Further, definitions of directions such as an up-and-down direction in the following description are merely definitions for convenience of understanding, and are not intended to limit the technical ideas of the present invention. For example, as a matter of course, when the subject is observed while being rotated by 90°, the subject is understood by converting the up-and-down direction into the right-and-left direction. When the subject is observed while being rotated by 180°, the subject is understood by inverting the up-and-down direction. In addition, an "upper surface" may be read as "front surface", and a "lower surface" may be read as "back surface".

Further, in the following description, there is exemplified a case where a first conductivity-type is an n-type and a second conductivity-type is a p-type. However, the relationship of the conductivity types may be inverted to set the first conductivity-type to the p-type and the second conductivity-type to the n-type. Further, a semiconductor region denoted by the symbol "n" or "p" attached with "+" indicates that such semiconductor region has a relatively high impurity concentration or a relatively low specific resistance as compared to a semiconductor region denoted by the symbol "n" or "p" without "+". A semiconductor region denoted by the symbol "n" or "p" attached with "−" indicates that such semiconductor region has a relatively low impurity concentration or a relatively high specific resistance as compared to a semiconductor region denoted by the symbol "n" or "p" without "−". However, even when the semiconductor regions are denoted by the same reference symbols "n" and "n", it is not indicated that the semiconductor regions have exactly the same impurity concentration or the same specific resistance.

In addition, a crystal polymorphism is present in silicon carbide (SiC) crystals, and main examples include 3C of a cubic crystal, and 4H and 6H of a hexagonal crystal. A bandgap at room temperature is reported that is 2.23 eV in SiC of 3C-structure (3C-SiC), 3.26 eV in SiC having 4H-structure (4H-SiC), and 3.02 eV in SiC having 6H-structure (6H-SiC). The following embodiments are illustrated with a case of mainly using 4H-SiC and 3C-SiC.

First Embodiment

<Structure of Silicon Carbide Semiconductor Device>

Figure 1:
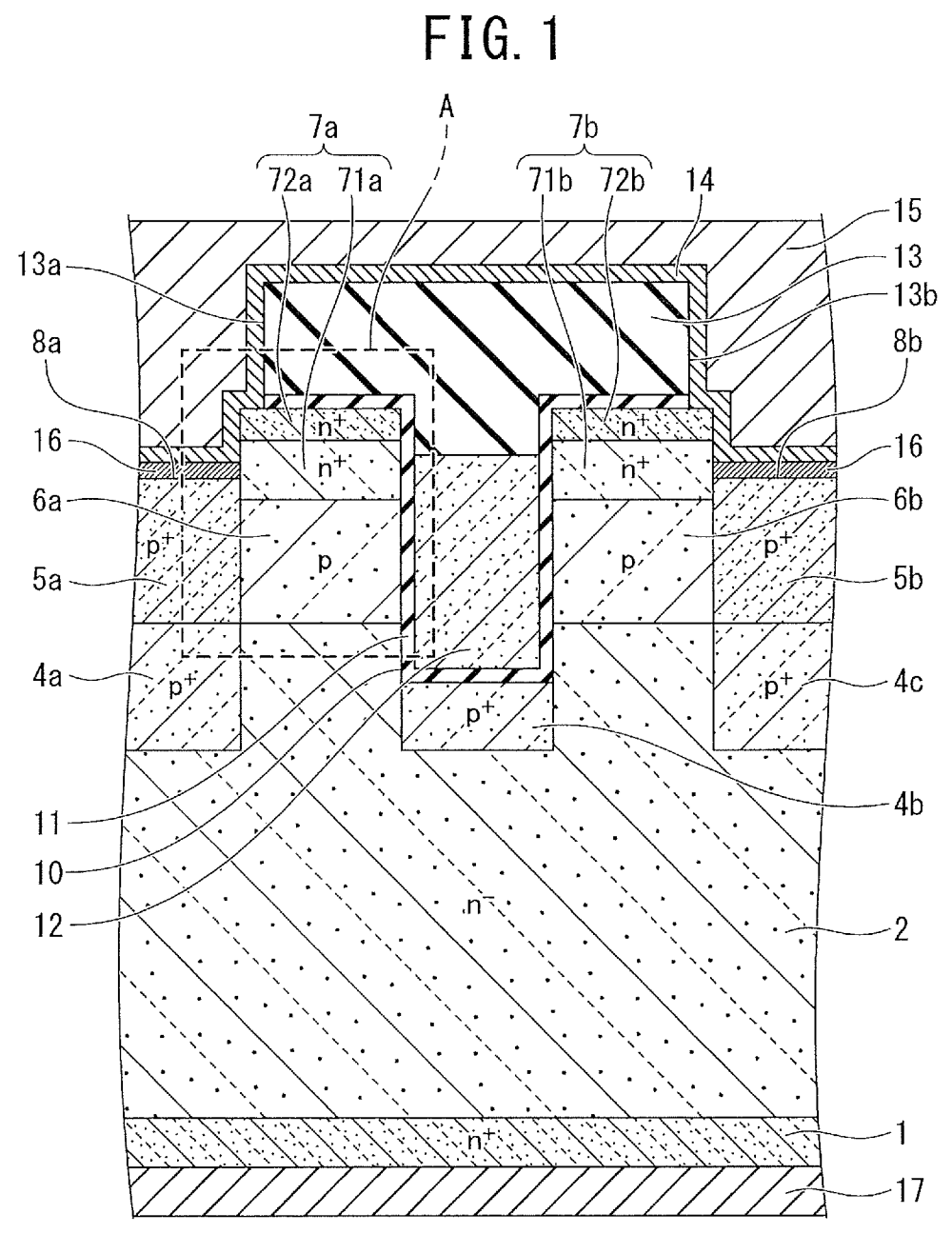

A silicon carbide semiconductor device according to a first embodiment is illustrated below with a case of including a trench-gate vertical MOSFET as an active element that is a vertical switching element, as illustrated in FIG. 1. While FIG. 1 illustrates a unit cell including an insulated gate electrode structure (11, 12) buried in a single trench (gate trench) 10, the semiconductor device actually includes the plural unit cells repeatedly arranged.

The silicon carbide semiconductor device according to the first embodiment includes a drift layer 2 of a first conductivity-type ($n^-$-type). The drift layer 2 is an epitaxially-grown layer including SiC such as 4H-SiC, for example. The drift layer 2 has an impurity concentration in a range of about $1\times10^{15}$ $cm^{-3}$ or greater and $5\times10^{16}$ $cm^{-3}$ or less, for example. The drift layer 2 has a thickness in a range of about 1 micrometer or greater and 100 micrometers or smaller, for example. The impurity concentration and the thickness of the drift layer 2 can be adjusted as appropriate depending on the breakdown voltage specifications, for example.

Base regions 6*a* and 6*b* of a second conductivity-type (p-type) are deposited on the top surface side of the drift layer 2. The respective bottom surfaces of the base regions 6*a* and 6*b* are in contact with the top surface of the drift layer 2. The base regions 6*a* and 6*b* are each a semiconductor region including SiC such as 4H-SiC obtained such that p-type impurity ions are implanted into the drift layer 2. The base regions 6*a* and 6*b* may each be an epitaxially-grown layer including SiC such as 4H-SiC. The respective base regions 6*a* and 6*b* have an impurity concentration in a range of about $1\times10^{16}$ $cm^{-3}$ or greater and $1\times10^{18}$ $cm^{-3}$ or less.

A current spreading layer (CSL) of the first conductivity-type (n-type) having a higher impurity concentration than the drift layer 2 may be provided between the drift layer 2 and the respective base regions 6*a* and 6*b*. The top surface of the drift layer 2 may be in contact with the bottom surface of the current spreading layer when provided, and the top surface of the current spreading layer may be in contact with the respective bottom surfaces of the base regions 6*a* and 6*b*.

First main regions (source regions) 7*a* and 7*b* of the first conductivity-type ($n^+$-type) having a higher impurity concentration than the drift layer 2 are selectively deposited on the top surface side of the base regions 6*a* and 6*b*. The source regions 7*a* and 7*b* are each a semiconductor region including SiC obtained such that n-type impurity ions are implanted into the drift layer 2, for example.

The source region 7*a* includes a source expansion region (a first region) 71*a* of $n^+$-type including a 3C-structure deposited on the top surface side of the base region 6*a*, and a source contact region (a second region) 72*a* of $n^+$-type including a 4H-structure deposited on the top surface side of the source expansion region 71*a*. The source region 7*b* includes a source expansion region (a first region) 71*b* of $n^+$-type including a 3C-structure deposited on the top surface side of the base region 6*b*, and a source contact region (a second region) 72*b* of $n^+$-type including a 4H-structure deposited on the top surface side of the source expansion region 71*b*. The respective source regions 7*a* and 7*b* are described in detail below.

The gate trench 10 is provided from the respective top surfaces of the source regions 7*a* and 7*b* in the normal direction with respect to the respective top surfaces of the source regions 7*a* and 7*b* (in the depth direction) to penetrate the source regions 7*a* and 7*b* and the base regions 6*a* and 6*b*. The bottom surface of the gate trench 10 reaches the drift layer 2. The gate trench 10 has a width of about one micrometer or smaller, for example. The source region 7*a* and the base region 6*a* are in contact with the side surface of the gate trench 10 on the left side. The source region 7*b* and the base region 6*b* are in contact with the side surface of the gate trench 10 on the right side. While FIG. 1 illustrates the case in which the bottom surface and the respective side surfaces of the gate trench 10 define the angular corners, the gate trench 10 may have a curved bottom surface instead.

A gate insulating film 11 is provided along the bottom surface and the side surfaces on both sides of the gate trench 10. Agate electrode 12 is buried inside the gate trench 10 with the gate insulating film 11 interposed. The gate insulating film 11 and the gate electrode 12 implement a trench-gate insulated gate electrode structure (11, 12).

The gate insulating film 11 as used herein can be a single-layer film of a silicon oxide ($SiO_2$) film, a silicon oxynitride (SiON) film, a strontium oxide (SrO) film, a silicon nitride ($Si_3N_4$) film, an aluminum oxide ($Al_2O_3$) film, a magnesium oxide (MgO) film, an yttrium oxide ($Y_2O_3$) film, a hafnium oxide ($HfO_2$) film, a zirconium oxide ($ZrO_2$) film, a tantalum oxide ($Ta_2O_5$) film, or a bismuth oxide ($Bi_2O_3$) film, or a composite film including some of the above films stacked on one another. The gate electrode 12 can be made of a polysilicon layer (a doped polysilicon layer) heavily doped with p-type or n-type impurity ions, or made of a layer including refractory metal such as titanium (Ti), tungsten (W), or nickel (Ni), for example.

Agate protection region 4*b* of the second conductivity-type ($p^+$-type) is provided under the gate trench 10 inside the drift layer 2. The top surface of the gate protection region 4*b* is in contact with the bottom surface of the gate trench 10. The top surface of the gate protection region 4*b* is not necessarily in contact with the bottom surface of the gate trench 10. The gate protection region 4*b* is a semiconductor region including SiC such as 4H-SiC obtained such that p-type impurity ions are implanted into the drift layer 2, for example. The gate protection region 4*b* has an impurity concentration in a range of about $1\times10^{17}$ $cm^{-3}$ or greater and $1\times10^{19}$ $cm^{-3}$ or less, for example. The gate protection region 4*b* may be electrically connected to the base region 6*a*.

The drift layer 2 is further provided inside with buried regions 4*a* and 4*c* of the second conductivity-type ($p^+$-type) separately from the gate protection region 4*b*. The buried regions 4*a* and 4*c* are located at substantially the same depth as the gate protection region 4*b*. The buried regions 4*a* and 4*c* are each a semiconductor region including SiC such as 4H-SiC obtained such that p-type impurity ions are implanted into the drift layer 2, for example. The respective buried regions 4*a* and 4*c* have an impurity concentration in a range of about $1\times10^{17}$ $cm^{-3}$ or greater and $1\times10^{19}$ $cm^{-3}$ or less, for example. A semiconductor region of $p^+$-type for connecting the respective buried regions 4*a* and 4*c* and the gate protection region 4*b* together may be selectively provided on the front side or the back side in the sheet of FIG. 1.

Base contact regions 5*a* and 5*b* of the second conductivity-type ($p^+$-type) having a higher impurity concentration than the base regions 6*a* and 6*b* are provided on the top surface side of the buried regions 4*a* and 4*c* at the upper part of the drift layer 2. The base contact regions 5*a* and 5*b* are each a semiconductor region including SiC such as 4H-SiC obtained such that p-type impurity ions are implanted into the drift layer 2, for example. The base contact regions 5*a* and 5*b* have an impurity concentration in a range of about $1\times10^{18}$ $cm^{-3}$ or greater and $1\times10^{21}$ $cm^{-3}$ or less, for example. The respective bottom surfaces of the base contact regions 5*a* and 5*b* have substantially the same depth as the respective bottom surfaces of the base regions 6*a* and 6*b*, but may be either shallower than or deeper than those of the base regions 6*a* and 6*b*.

The bottom surface of the base contact region 5*a* is in contact with the top surface of the buried region 4*a*. The side surface of the base contact region 5*a* is in contact with the base region 6*a* and the source expansion region 71*a*, but is not in contact with the source contact region 72*a*. The bottom surface of the base contact region 5*b* is in contact with the top surface of the buried region 4*c*. The side surface of the base contact region 5*b* is in contact with the base region 6*b* and the source expansion region 71*b*, but is not in contact with the source contact region 72*b*. When the bottom surface of the base contact region 5*a* is located at a position shallower than the bottom surface of the base region 6*a*, the bottom surface of the base contact region 5*a* is in contact with the top surface of the base region 6*a*, and the top surface of the buried region 4*a* is in contact with the bottom surface of the base region 6*a*.

Although not illustrated in FIG. 1, the plural gate trenches 10 are arranged in the right-left direction in FIG. 1. Other trenches (contact trenches) 8*a* and 8*b* different from the gate trenches 10 are provided between the gate trenches 10 adjacent to each other and separately from the respective gate trenches 10. The contact trenches 8*a* and 8*b* have a shallower depth than the gate trenches 10. The bottom surface of the contact trench 8*a* is located at a position deeper than the bottom surface of the source contact region 72*a* and shallower than the bottom surface of the source expansion region 71*a*. The bottom surface of the contact trench 8*a* is in contact with the top surface of the base contact region 5*a*. The side surface of the contact trench 8*a* is in contact with the respective side surfaces of the source expansion region 71*a* and the source contact region 72*a*.

The bottom surface of the contact trench 8*b* is located at a position deeper than the bottom surface of the source contact region 72*b* and shallower than the bottom surface of the source expansion region 71*b*. The bottom surface of the contact trench 8*b* is in contact with the top surface of the base contact region 5*b*. The side surface of the contact trench 8*b* is in contact with the respective side surfaces of the source expansion region 71*b* and the source contact region 72*b*.

An interlayer insulating film 13 is deposited on the top surface side of the gate electrode 12. The interlayer insulating film 13 is a single-layer film, such as a borophosphosilicate glass film (a BPSG film), a phosphosilicate glass film (a PSG film), a non-doped silicon oxide film without containing phosphorus (P) or boron (B) which is referred to as a non-doped silicate glass (NSG) film, a borosilicate glass film (a BSG film), or a silicon nitride ($Si_3N_4$) film, or a stacked-layer film including the above films stacked on one another. The interlayer insulating film 13 is provided with contact holes 13*a* and 13*b* to which a part of the respective top surfaces of the source contact regions 72*a* and 72*b* and the contact trenches 8*a* and 8*b* are exposed.

A first main electrode (a source electrode) (14, 15, 16) is provided to fill the contact trenches 8*a* and 8*b* exposed to the contact holes 13*a* and 13*b* of the interlayer insulating film 13 and further cover the top surface of the interlayer insulating film 13 and a part of the respective top surfaces of the source contact regions 72*a* and 72*b* exposed to the contact holes 13*a* and 13*b*. The source electrode (14, 15, 16) includes a barrier metal layer 14, a source wiring layer 15, and a silicide layer 16.

The silicide layer 16 is selectively provided on the respective top surfaces of the base contact regions 5*a* and 5*b* exposed to the bottom surfaces of the contact trenches 8*a* and 8*b* so as to be in ohmic contact with the respective top surfaces of the base contact regions 5*a* and 5*b* at a low resistance. The silicide layer 16 includes silicide such as nickel silicide ($NiSi_x$). The source electrode (14, 15, 16) may only include the barrier metal layer 14 and the source wiring layer 15 without the silicide layer 16. The respective top surfaces of the base contact regions 5*a* and 5*b* in the case without the silicide layer 16 may be in contact with the barrier metal layer 14.

The barrier metal layer 14 is provided to cover the interlayer insulating film 13, the respective side surfaces of the contact holes 13*a* and 13*b* of the interlayer insulating film 13, the source expansion regions 71*a* and 71*b* and the source contact regions 72*a* and 72*b* exposed to the side surfaces of the contact trenches 8*a* and 8*b*, and the silicide layer 16 exposed to the respective bottom surfaces of the contact trenches 8*a* and 8*b*. The barrier metal layer 14 is directly in contact with the source expansion regions 71*a* and 71*b* and the source contact regions 72*a* and 72*b*. The barrier metal layer 14 is in ohmic contact with the source contact regions 72*a* and 72*b* including a 3C-structure at a low resistance, but is not in ohmic contact with the source expansion regions 71*a* and 71*b* including a 4H-structure. The barrier metal layer 14 includes titanium nitride (TiN), titanium (Ti), or metal having a stacked-layer structure of TiN/Ti including Ti as a lower layer, for example.

The source wiring layer 15 is provided to cover the barrier metal layer 14. The source wiring layer 15 is electrically connected to the source contact regions 72*a* and 72*b* and the base contact regions 5*a* and 5*b*. The source wiring layer 15 includes metal or an alloy, such as aluminum (Al), aluminum-silicon (Al—Si), aluminum-copper (Al—Cu), and copper (Cu), for example. The source wiring layer 15 is provided separately from a gate wiring electrode (not illustrated) electrically connected to the gate electrode 12.

A second main region (a drain region) 1 of the first conductivity-type ($n^+$-type) having a higher impurity concentration than the drift layer 2 is deposited on the bottom surface side of the drift layer 2. The drain region 1 is made of a semiconductor substrate (a SiC substrate) including SiC such as 4H-SiC, for example. The drain region 1 has an impurity concentration in a range of about $1\times10^{18}$ $cm^{-3}$ or greater and $3\times10^{20}$ $cm^{-3}$ or less, for example. The drain region 1 has a thickness in a range of about 30 micrometers or greater and 500 micrometers or smaller, for example. A dislocation conversion layer or a recombination promotion layer having a higher impurity concentration than the drift layer 2 and having a lower impurity concentration than the drain region 1 may be provided as an n-type buffer layer between the drift layer 2 and the drain region 1.

A second main electrode (a drain electrode) 17 is deposited on the bottom surface side of the drain region 1. The drain electrode 17 can be a single-layer film including gold (Au), or a metallic film including titanium (Ti), nickel (Ni), and Au stacked in this order from the drain region 1 side, and may be further provided with a metallic film including molybdenum (Mo) or tungsten (W) as the lowermost layer, for example. A drain contact layer such as a nickel silicide ($NiSi_x$) layer for ensuring an ohmic contact may be provided between the drain region 1 and the drain electrode 17.

The gate trench 10 illustrated in FIG. 1 has a planar pattern extending in a stripe state in the horizontal direction from the front side to the back side in the sheet of FIG. 1. The gate trench 10 is not limited to the stripe-shaped planar pattern, and may have another planar pattern such as a dot-like or grid-like planar pattern instead. The source expansion regions 71*a* and 71*b*, the source contact regions 72*a* and 72*b*, and the base contact regions 5*a* and 5*b* each have a planar pattern extending in a stripe state parallel to the gate trench 10.

FIG. 2 is a schematic enlarged cross-sectional view illustrating region A of the semiconductor device according to the first embodiment indicated by the broken line shown in FIG. 1. The structure regarding the source expansion region 71*a* and the source contact region 72*a* and the positional relation between the source expansion region 71*a*, the source contact region 72*a*, the base contact region 5*a*, and the insulated gate electrode structure (11, 12) are described below with reference to FIG. 2.

A depth d1 of the source expansion region 71*a* from the top surface of the source contact region 72*a* is in a range of about 150 nanometers or greater and 450 nanometers or smaller, for example. A width w1 of the source expansion region 71*a* is in a range of about 400 nanometers or greater and 1000 nanometers or smaller, for example. The side surface of the source expansion region 71*a* on the right side is directly in contact with the gate insulating film 11 so as to be opposed to the gate electrode 12 with the gate insulating film 11 interposed. The side surface of the source expansion region 71*a* on the left side is in contact with the base contact region 5*a*, the side surface of the contact trench 8*a*, the silicide layer 16, and the barrier metal layer 14. A depth d3 of the contact trench 8*a* from the top surface of the source contact region 72*a* is in a range of about 40 nanometers or greater and 450 nanometers or smaller, for example.

The source expansion region 71*a* has fewer crystal defects than the source contact region 72*a*, while not taking over the crystal defects from the source contact region 72*a*. The source expansion region 71*a* includes 4H-SiC, and more particularly, the source expansion region 71*a* is a region mainly including 4H-SiC (a 4H-structure) but hardly including 3C-SiC. The proportion of 4H-SiC included in the source expansion region 71*a* is in a range of about 90% or greater and 100% or smaller, for example. The source expansion region 71*a* may slightly include an amorphous structure and 3C-SiC, for example, in addition to 4H-SiC. The impurity concentration of the source expansion region 71*a* is in a range of about $1\times10^{16}$ $cm^{-3}$ or greater and $1\times10^{20}$ $cm^{-3}$ or less, for example. The source expansion region 71*a* includes nitrogen (N) or phosphorus (P) as n-type impurity ions, for example. The source expansion region 71*a* may further include arsenic (As) as n-type impurity ions.

A depth d2 from the top surface to the bottom surface of the source contact region 72*a* (that is a thickness of the source contact region 72*a*) is in a range of about 30 nanometers or greater and 100 nanometers or smaller, for example. A width w1 of the source contact region 72*a* substantially conforms to that of the source expansion region 71*a*, and is in a range of about 400 nanometers or greater and 1000 nanometers or smaller, for example.

The side surface of the source contact region 72*a* on the right side is directly in contact with the gate insulating film 11 so as to be opposed to the interlayer insulating film 13 with the gate insulating film 11 interposed, but is not opposed to the gate electrode 12. The side surface of the source contact region 72*a* on the left side is in contact with the side surface of the contact trench 8*a* and the barrier metal layer 14. A part of the top surface connected to the side surface of the source contact region 72*a* on the left side is exposed to the contact hole 13*a* of the interlayer insulating film 13 and is in contact with the barrier metal layer 14.

The source contact region 72*a* is a part including 3C-SiC (a 3C-structure). The proportion of 3C-SiC included in the source contact region 72*a* is higher than that in the source expansion region 71*a*, and is set in a range of about 10% or greater and 100% or smaller, for example. The source contact region 72*a* may have a mixed-crystal structure of 3C-SiC and 4H-SiC. The source contact region 72*a* may further include an amorphous structure and 4H-SiC, for example, in addition to 3C-SiC. The source contact region 72*a*, when including 3C-SiC that has a narrower bandgap than 4H-SiC, can be led to be in ohmic contact with the barrier metal layer 14 of the source electrode (14, 15, 16) at a low resistance without the silicide layer 16 interposed. To achieve a good ohmic contact, the proportion of 3C-SiC included in the source contact region 72*a* is preferably 10% or greater.

The source contact region 72*a* has a higher impurity concentration than the source expansion region 71*a*, or has substantially the same impurity concentration as the source expansion region 71*a*. The impurity concentration of the source contact region 72*a* is in a range of about $1\times10^{20}$ $cm^{-3}$ or greater and $1\times10^{22}$ $cm^{-3}$ or less, for example.

The source contact region 72*a* includes phosphorus (P) or arsenic (As) as n-type impurity ions, for example. The source contact region 72*a* may also include nitrogen (N) as n-type impurity ions. The source contact region 72*a* may include some of P, As, and N combined as appropriate as n-type impurity ions. The source contact region 72*a* may include an inactive element such as argon (Ar) or helium (He), for example.

The respective crystal structures of the source expansion region 71*a* and the source contact region 72*a* can be formed independently of each other such that some conditions such as the element to be implanted, the temperature during the ion implantation, the dose (the impurity concentration), and the activation temperature are changed for each of the source expansion region 71*a* and the source contact region 72*a*. The source contact region 72*a* including 3C-SiC is formed, for example, such that n-type impurity ions or an inactive element is implanted to 4H-SiC at a room temperature at a high impurity concentration (with a high dose) so as to destroy 4H-SiC to form an amorphous structure by use of damage during the ion implantation. The activation annealing is then executed to lead the amorphous structure to turn to 3C-SiC when recrystallized, so as to form the source contact region 72*a* including 3C-SiC accordingly.

The source expansion region 71*a* including 4H-SiC is formed such that n-type impurity ions are implanted to 4H-SiC either at a room temperature or at a high temperature (for example, in a range of about 200° C. or higher and 600° C. or lower) at an impurity concentration (with a dose) that can sufficiently avoid destruction of the structure of 4H-SiC so as to keep 4H-SiC.

The respective crystal structures of the source expansion region 71*a* and the source contact region 72*a* can be measured (observed) such that a ratio of the areas of the crystal structures on the surfaces is measured by use of a field-emission scanning electron microscope (FE-SEM) and electron backscatter diffraction (EBSD). The present embodiment executed the measurement, as an example, such that samples were prepared under the common conditions of the impurity ions to be implanted, the dose (the impurity concentration), and the activation temperature, while the different temperatures were used upon the ion implantation that were 500° C. and a room temperature (25° C.), so as to be measured by use of the FE-SEM and the EBSD. The proportion of 4H-SIC on the surface in the sample obtained at 500° C. was 100%. The proportion of 4H-SiC on the surface in the sample obtained at the room temperature was 86%, while the proportion of 3C-SiC was 14%.

The method of forming the base contact region 5*a* including 4H-SiC is the same as the method of forming the source expansion region 71*a* including 4H-SiC. The base contact region 5*a* including 4H-SiC can be formed such that p-type impurity ions are implanted to 4H-SiC either at a room temperature or at a high temperature (for example, in a range of about 200° C. or higher and 600° C. or lower) at an impurity concentration (with a dose) that can sufficiently avoid destruction of the structure of 4H-SiC so as to keep 4H-SiC. The base contact region 5*a* includes aluminum (Al) or boron (B) as p-type impurities, for example.

As illustrated in FIG. 2, the end of the top surface of the gate electrode 12 in contact with the gate insulating film 11 is located at a position deeper than the bottom surface of the source contact region 72*a* at a part in contact with the gate insulating film 11 and shallower than the bottom surface of the source expansion region 71*a* at a part in contact with the gate insulating film 11. The top surface of the gate electrode 12 at the part in contact with the gate insulating film 11 may be the uppermost surface of the gate electrode 12. For example, when the entire top surface of the gate electrode 12 is concave, the top surface in the middle of the gate electrode 12 may be located at a position deeper than the top surface at the end part of the gate electrode 12.

The gate electrode 12 is opposed to the source expansion region 71*a* with the gate insulating film 11 interposed, while the gate electrode 12 and the source contact region 72*a* are not opposed to each other. A drop amount d0 of the gate electrode 12 from the top surface of the source contact region 72*a* is in a range of about 100 nanometers or greater and 300 nanometers or smaller, for example. The drop amount d0 of the gate electrode 12 and the position of the top surface of the gate electrode 12 in contact with the gate insulating film 11 can be regulated such that the etching conditions used for the gate electrode 12 are adjusted, for example.

The end of the top surface of the gate electrode 12 in contact with the gate insulating film 11 may be shallower than the bottom surface of the source contact region 72*a* at the position in contact with the gate insulating film 11 instead.

The source expansion region 71*b* and the source contact region 72*b* of the source region 7*b* illustrated in FIG. 1 have the configurations common to those of the source expansion region 71*a* and the source contact region 72*a* of the source region 7*a*, respectively, and overlapping explanations are not repeated below. The positional relation between the source expansion region 71*b* and the source contact region 72*b* of the source region 7*b*, the base contact region 5*b*, and the insulated gate electrode structure (11, 12) is also common to that between the source expansion region 71*a* and the source contact region 72*a* of the source region 7*a*, the base contact region 5*a*, and the insulated gate electrode structure (11, 12) illustrated in FIG. 2, and overlapping explanations are not repeated below.

The silicon carbide semiconductor device according to the first embodiment during the switching operation applies a positive voltage to the drain electrode 17 while using the source electrode (14, 15, 16) as a ground potential, and causes an inversion layer (a channel) to be formed in the respective base regions 6*a* and 6*b* toward the side surfaces of the gate trench 10 so as to be in the ON-state when a positive voltage of a threshold or greater is applied to the gate electrode 12. In the ON-state, a current flows from the drain electrode 17 toward the source electrode (14, 15, 16) through the drain region 1, the drift layer 2, the respective inversion layers of the base regions 6*a* and 6*b*, and the source regions 7*a* and 7*b*. When the voltage applied to the gate electrode 12 is smaller than the threshold, the silicon carbide semiconductor device is led to be in the OFF-state since no inversion layer is formed in the respective base regions 6*a* and 6*b*, while no current flows from the drain electrode 17 toward the source electrode (14, 15, 16).

The configuration of the silicon carbide semiconductor device according to the first embodiment can lead the source contact regions 72*a* and 72*b* of the source regions 7*a* and 7*b* including 3C-SiC to be in ohmic contact with the source electrode (14, 15, 16) at a low resistance without the interposition of the silicide layer 16. The present embodiment thus can eliminate a problem of separation of the silicide layer 16 on the contact joint surface of the respective source contact regions 72*a* and 72*b*, since the silicide layer 16 does not need to be provided. Further, a part of the side surfaces and the top surface of the respective source contact regions 72*a* and 72*b* is in ohmic contact with the source electrode (14, 15, 16), so as to reduce a contact resistance accordingly.

Further, the silicon carbide semiconductor device according to the first embodiment has the configuration in which the contact trenches 8*a* and 8*b* have the deeper bottom surface than the source contact regions 72*a* and 72*b* so as to prevent the source contact regions 72*a* and 72*b* including 3C-SiC from being in contact with the base contact regions 5*a* and 5*b* including 4H-SiC. This configuration can exclude damage derived from the ion implantation for the source expansion regions 71*a* and 71*b* to be formed in the base contact regions 5*a* and 5*b*, so as to avoid a leakage defect accordingly, as compared with a case in which the source contact regions 72*a* and 72*b* and the base contact regions 5*a* and 5*b* are in contact with each other without the contact trenches 8*a* and 8*b* provided.

Further, the silicon carbide semiconductor device according to the first embodiment, which has the configuration in which the respective source expansion regions 71*a* and 71*b* and the respective base contact regions 5*a* and 5*b* implementing the p-n junction both include 4H-SiC, can avoid a leak current at the p-n junction part, as compared with a case in which the source contact regions 72*a* and 72*b* including 3C-SiC with a large amount of crystal defects remaining and the base contact regions 5*a* and 5*b* including 4H-SiC implement the p-n junction.

Further, the silicon carbide semiconductor device according to the first embodiment has the configuration in which the top surface of the gate electrode 12 is located at a position deeper than the bottom surface of the source contact region 72*a* and shallower than the bottom surface of the source expansion region 71*a*. This configuration leads the source expansion region 71*a* of the source region 7*a* having a relatively small amount of crystal defects with less surface roughness to be opposed to the gate electrode 12 with the gate insulating film 11 interposed, while the source contact region 72*a* of the source region 7*a* having a relatively large amount of crystal defects with larger surface roughness is not opposed to the gate electrode 12. The configuration according to the first embodiment thus can suppress a cause of a leak current between the source region 7*a* and the gate electrode 12.

<Method of Manufacturing Silicon Carbide Semiconductor Device>

An example of a method of manufacturing the silicon carbide semiconductor device according to the first embodiment is described below. It should be understood that the method of manufacturing the silicon carbide semiconductor device described below is an example, and the silicon carbide semiconductor device can be manufactured by other methods including modified examples of this embodiment within the scope of the appended claims.

First, the semiconductor substrate (the SiC substrate) 1 of $n^+$-type (refer to FIG. 3) including SiC such as 4H-SiC doped with n-type impurity ions such as nitrogen (N) is prepared. The top surface of the SiC substrate 1 has an off-angle of three to eight degrees with respect to a {0001}-plane, for example. Next, as illustrated in FIG. 3, the drift layer 2 of $n^-$-type including SiC such as 4H-SiC doped with n-type impurity ions such as N and having a lower impurity concentration than the SiC substrate 1 is epitaxially grown on the top surface of the SiC substrate 1.

Next, an oxide film is deposited on the top surface of the drift layer 2 by chemical vapor deposition (CVD), for example. A photoresist film is then applied to the top surface of the oxide film, and the oxide film is delineated by photolithography and dry etching, for example. Using the delineated oxide film as a mask for ion implantation, p-type impurity ions such as aluminum (Al) are selectively implanted. Instead of the oxide film, the photoresist film may be used as the mask for ion implantation. The oxide film used as the mask for ion implantation is then removed. This step provides the $p^+$-type buried regions 4*a* and 4*c* and the $p^+$-type gate protection region 4*b* selectively inside the drift layer 2, as illustrated in FIG. 4.

Figure 3:
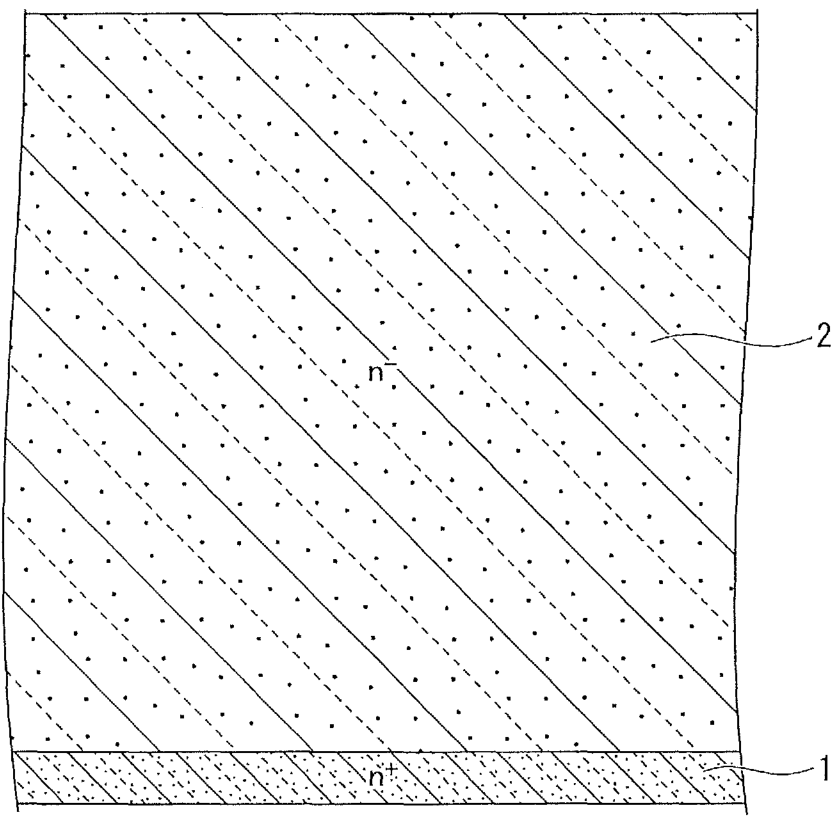
FIG. 3 is a schematic cross-sectional view for explaining an example of a method of manufacturing the silicon carbide semiconductor device according to the first embodiment.
Figure 4:
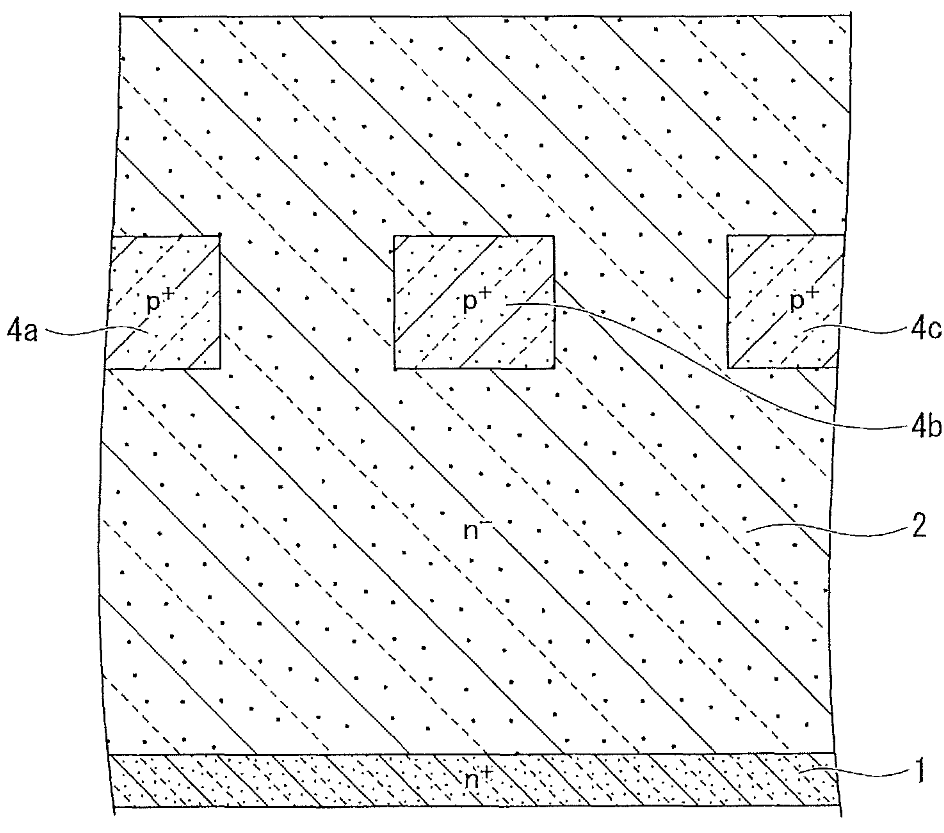
FIG. 4 is a schematic cross-sectional view continued from FIG. 3, for explaining the example of the method of manufacturing the silicon carbide semiconductor device according to the first embodiment.

Alternatively, the structure illustrated in FIG. 4 may be obtained such that the drift layer 2 is epitaxially grown to the middle (the lower part) illustrated in FIG. 3, and the rest (the upper part) of the drift layer 2 is further epitaxially grown after the $p^+$-type buried regions 4*a* and 4*c* and the $p^+$-type gate protection region 4*b* are formed by the ion implantation.

Figure 5:
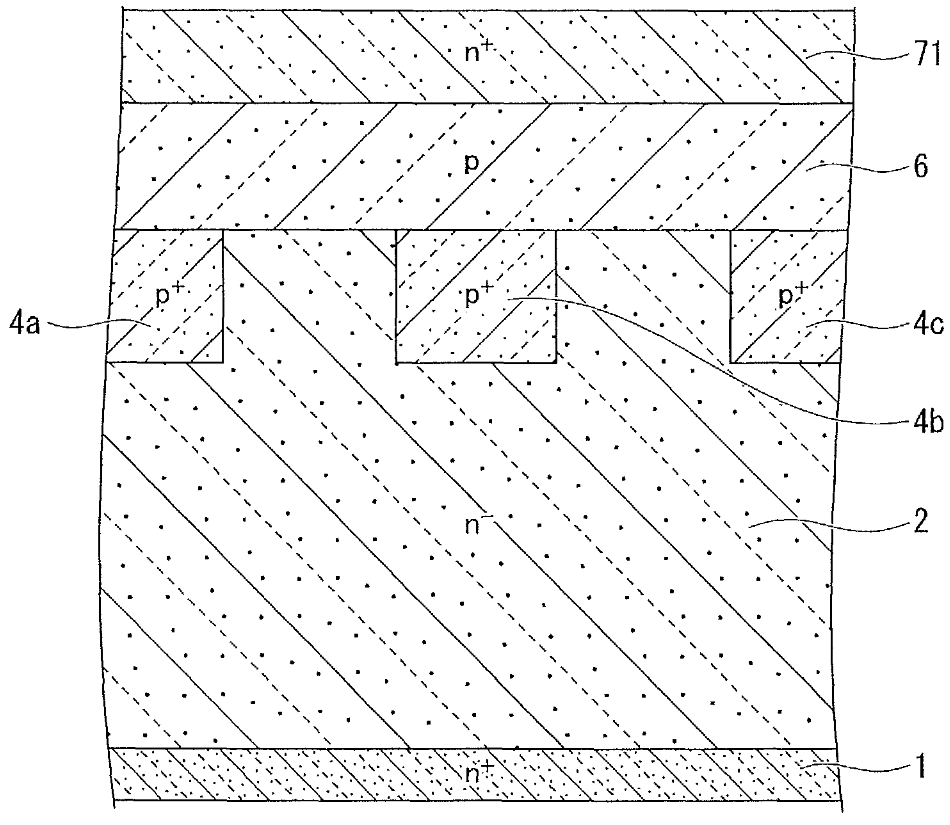
FIG. 5 is a schematic cross-sectional view continued from FIG. 4, for explaining the example of the method of manufacturing the silicon carbide semiconductor device according to the first embodiment.

Next, p-type impurity ions such as aluminum (Al) are implanted to the entire surface at a lower acceleration voltage than that during the ion implantation for forming the buried regions 4*a* and 4*c* and the gate protection region 4*b* so as to form the base region 6. Further, n-type impurity ions such as nitrogen (N) are implanted to the entire surface at a lower acceleration voltage than that during the ion implantation for forming the base region 6 so as to form the source expansion region 71. This step forms the p-type base region 6 including 4H-SiC on the top surface side of the buried regions 4*a* and 4*c* and the gate protection region 4*b*, as illustrated in FIG. 5. The $n^+$-type source expansion region 71 including 4H-SiC is further formed on the top surface side of the base region 6.

Upon the ion implantation for the source expansion region 71, phosphorus (P: element number 15) having a relatively small atomic number is preferably used, and nitrogen (N: element number 7) having a smaller atomic number is more preferably used, as the n-type impurity ions, in order to have less damage than the ion implantation for the source contact region 72 described below. In addition to P or N, arsenic (As: element number 33) having a relatively large atomic number may be implanted. The temperature during the ion implantation in this step is set to be higher than the temperature during the ion implantation for the source contact regions 72*a* and 72*b* described below, and is in a range of 200° C. or higher and 600° C. or lower, for example. The dose of the impurity ions to be implanted is set such that the impurity concentration of the source expansion region 71 is in a range of about $1\times10^{16}$ $cm^{-3}$ or greater and $1\times10^{20}$ $cm^{-3}$ or less, for example. The dose of the impurity ions to be implanted is set to about less than $2\times10^{15}$ $cm^{-2}$, for example.

Figure 6:
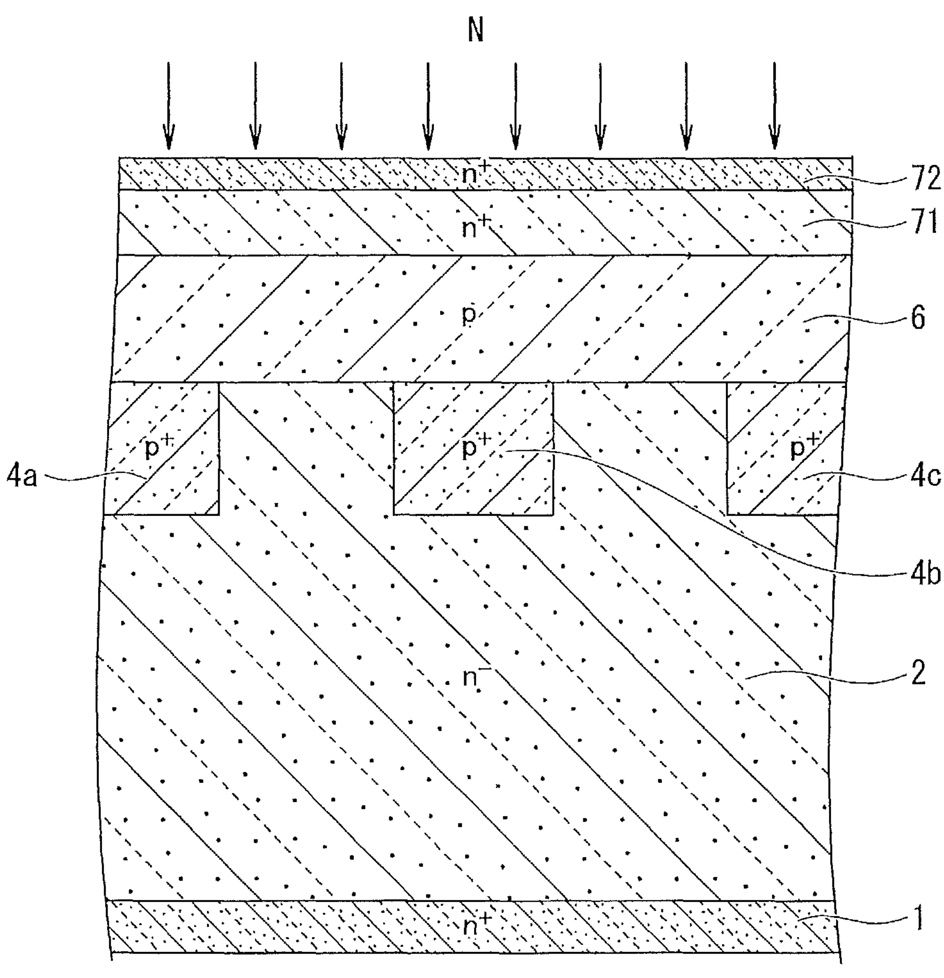
FIG. 6 is a schematic cross-sectional view continued from FIG. 5, for explaining the example of the method of manufacturing the silicon carbide semiconductor device according to the first embodiment.

Next, as illustrated in FIG. 6, n-type impurity ions such as nitrogen (N) are implanted to the entire surface at a lower acceleration voltage than that during the ion implantation for forming the source expansion region 71 so as to form the source contact region 72. This step selectively forms the $n^+$-type source contact region 72 in a part on the top surface side (at the upper part) of the source expansion region 71.

The execution of the ion implantation for the source contact region 72 breaks the structure of 4H-SiC on the top surface side of the source expansion region 71 so as to form the amorphous structure. While FIG. 6 illustrates the case of the implantation of nitrogen (N) as the n-type impurities, the use of phosphorus (P) having a relatively large atomic number as the n-type impurities is preferable, and the use of arsenic (As) having a greater atomic number is more preferable in order to have greater damage than the ion implantation for the source expansion region 71 described above. The same impurity ions as the impurity ions implanted for the source expansion region 71 described above may be implanted for the source contact region 72, or different impurity ions may be implanted instead. The temperature during the ion implantation in this step is set to be lower than the temperature during the ion implantation for the source expansion region 71 described above, and is in a range of 20° C. or higher and 150° C. or lower, for example. The total dose of the impurity ions to be implanted including the impurity ions implanted to the source expansion region 71 described above is set such that the impurity concentration of the source contact region 72 is in a range of about $1\times10^{20}$ $cm^{-3}$ or greater and $1\times10^{22}$ $cm^{-3}$ or less, for example. The total dose of the impurity ions to be implanted including the dose of the impurity ions implanted to the source expansion region 71 described above is set to about $2\times10^{15}$ $cm^{-2}$ or greater, for example.

Upon the ion implantation for the source contact region 72, an inactive element such as argon (Ar) or helium (He) may be implanted instead of the n-type impurity ions. The dose of the inactive element to be implanted is set such that the total dose including the dose of the impurity ions implanted to the source expansion region 71 described above is to be about $2\times10^{15}$ $cm^{-2}$ or greater, for example. When the inactive element is used for the ion implantation, the source expansion region 71 and the source contact region 72 have substantially the same impurity concentration, since the implantation of the n-type impurity ions is only executed for the formation of the source expansion region 71. The oxide film 20 used as the mask for ion implantation is removed after the ion implantation for the formation of the source contact region 72.

Figure 7:
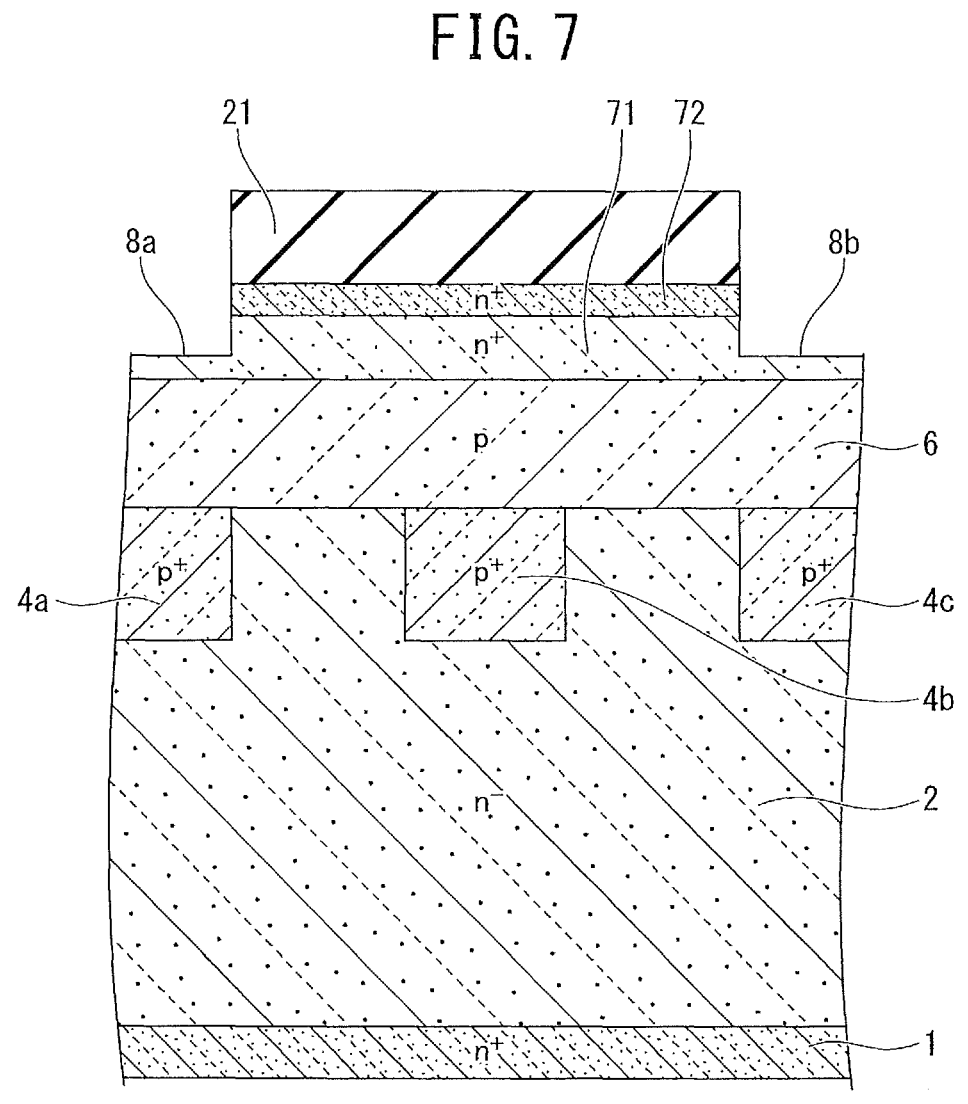

Next, an oxide film 21 (refer to FIG. 7) is deposited on the top surface of the base region 6 by CVD or the like. A photoresist film is then applied to the top surface of the oxide film 21, and the oxide film 21 is delineated by photolithography and dry etching. Using the delineated oxide film 21 as a mask for etching, a part of each of the source contact region 72 and the source expansion region 71 located over the buried regions 4*a* and 4*c* is selectively removed by dry etching such as reactive ion etching (RIE), as illustrated in FIG. 7. The respective contact trenches 8*a* and 8*b* are thus formed. The contact trenches 8*a* and 8*b* are dug to a depth such that the respective bottom surfaces are located at a position deeper than the bottom surface of the source contact region 72. The source expansion region 71 is exposed to the respective bottom surfaces of the contact trenches 8*a* and 8*b*. The source expansion region 71 and the source contact region 72 are exposed to the respective side surfaces of the contact trenches 8*a* and 8*b*. The contact trenches 8*a* and 8*b* may be further dug to a depth such that the respective bottom surfaces are located at a position deeper than the bottom surface of the source expansion region 71.

Figure 8:
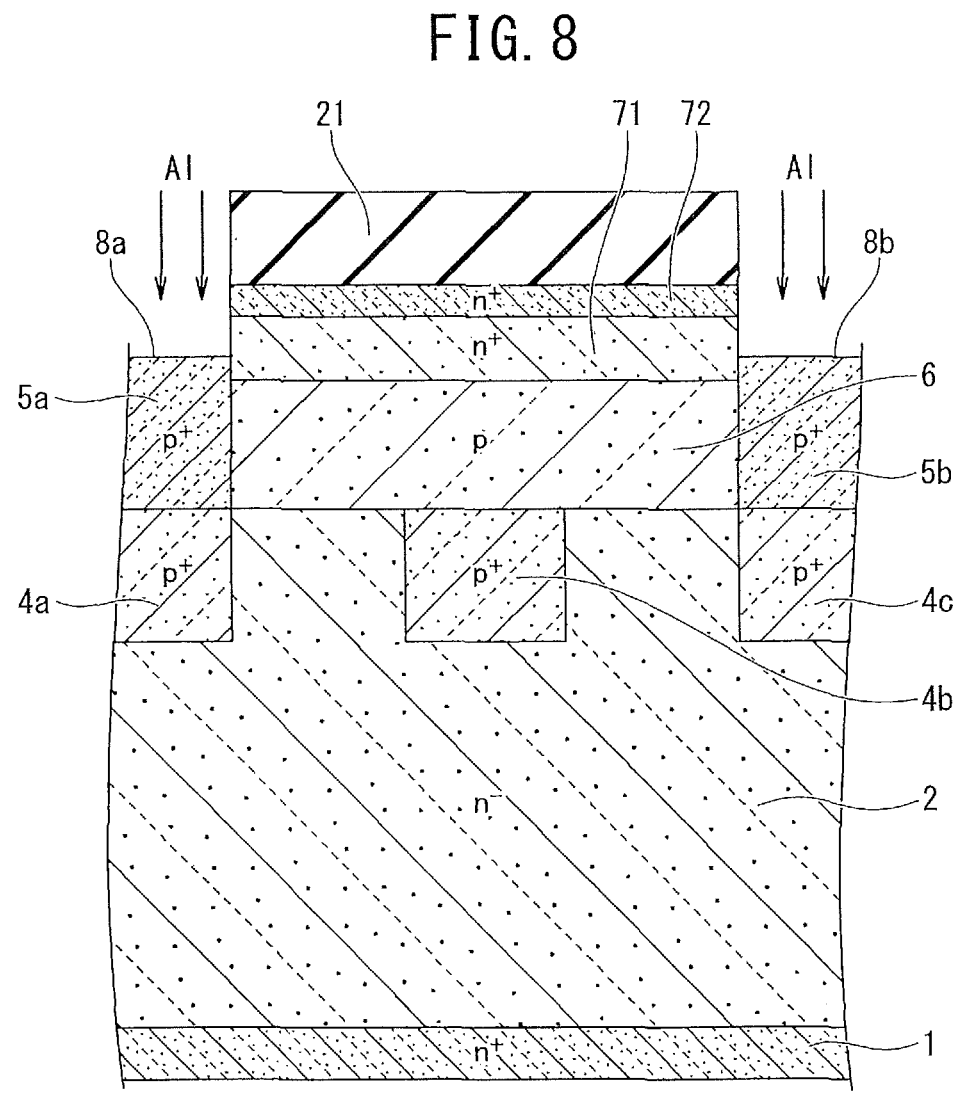

Using the above oxide film 21 used as the mask for etching continuously as a mask for ion implantation, p-type impurity ions such as aluminum (Al) or boron (B) are selectively implanted, as illustrated in FIG. 8, so as to invert (turn back) the conductivity of a part of the source expansion region 71 from the n-type to the p-type. This step selectively forms the $p^+$-type base contact regions 5a and 5b including 4H-SiC on the top surface side of the buried regions 4a and 4c. The respective side surfaces of the base contact regions 5a and 5b are in contact with the source expansion region 71 and the base region 6 but are not in contact with the source contact region 72. Instead of the oxide film 21, the photoresist film may be used as the mask for both etching and ion implantation. The oxide film 21 used as the common mask is then removed.

The order of executing the ion implantation for forming the buried regions 4a and 4c and the gate protection region 4b, the ion implantation for forming the base region 6, the ion implantation for forming the source expansion region 71, the ion implantation for forming the source contact region 72, and the ion implantation for forming the base contact regions 5a and 5b is not limited to the case described above, and may be changed as appropriate.

Alternatively, the order of the steps illustrated in FIG. 7 and FIG. 8 may be reversed. In particular, the ion implantation for forming the base contact regions 5a and 5b illustrated in FIG. 8 may be executed first before the dry etching illustrated in FIG. 7 (this leads to a structure similar to that illustrated in FIG. 13 described below), followed by the dry etching illustrated in FIG. 7, so as to provide the structure illustrated in FIG. 8.

Next, activation annealing (heat treatment) is executed by use of an annealing furnace or the like at a temperature in a range of about 1600° C. or higher and 1900° C. or lower, for example, so as to collectively activate the p-type impurity ions or the n-type impurity ions implanted into the buried regions 4a and 4c, the gate protection region 4b, the source expansion region 71, the source contact region 72, the base contact regions 5a and 5b, and the like. At this point, the amorphous structure in the source contact region 72 is recrystallized to turn to 3C-SiC, so as to form the source contact region 72 including 3C-SiC.

While the present embodiment is illustrated with the case in which the single activation annealing is collectively executed after all of the ion implantation steps, the activation annealing may be executed several times independently after each of the ion implantation steps. Alternatively, the present embodiment may include a process of forming a cap film including carbon (C), executing the activation annealing with the cap film formed, and then removing the cap film after the activation annealing.

Figure 9:
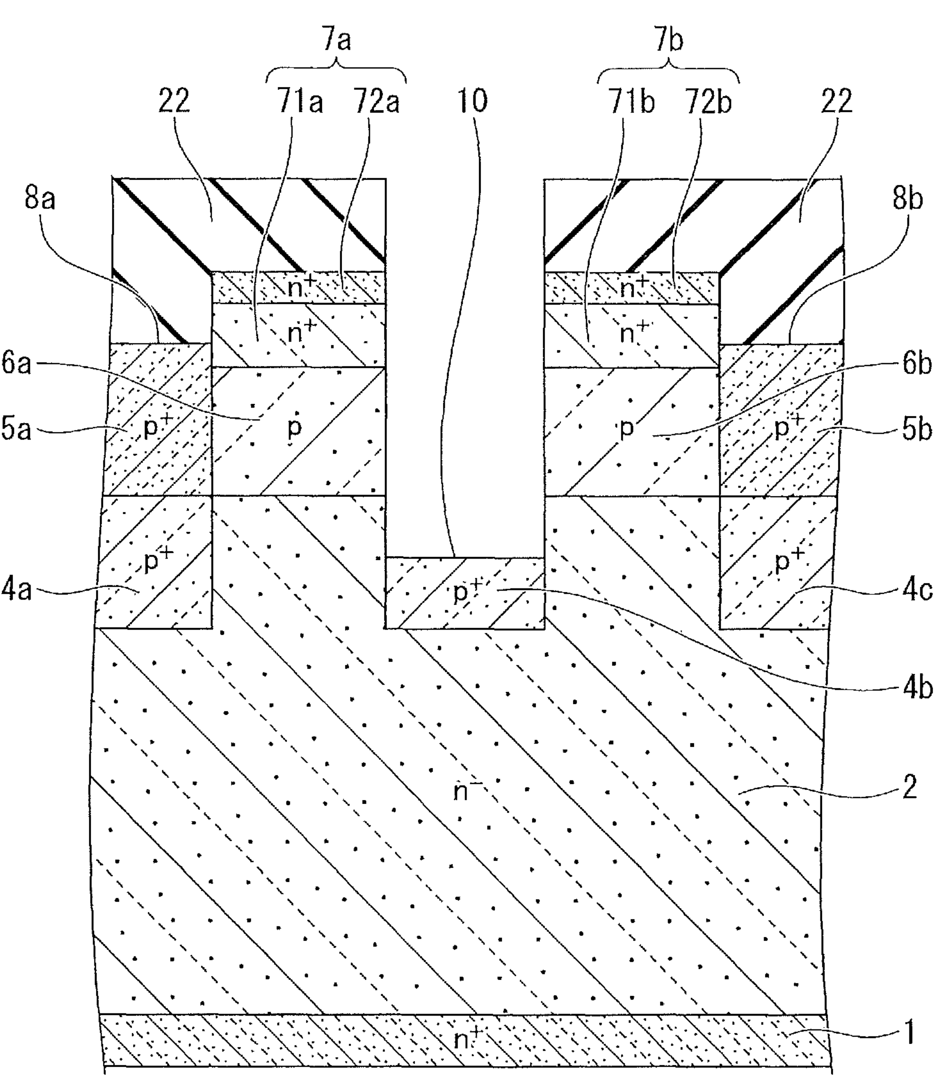
FIG. 9 is a schematic cross-sectional view continued from FIG. 8, for explaining the example of the method of manufacturing the silicon carbide semiconductor device according to the first embodiment.

Next, an oxide film 22 (refer to FIG. 9) is deposited on the respective top surfaces of the source contact region 72 and the base contact regions 5a and 5b by CVD or the like. A photoresist film is then applied to the top surface of the oxide film 22, and the oxide film 22 is delineated by photolithography and dry etching. Using the delineated oxide film 22 as a mask for etching, a part of each of the source contact region 72, the source expansion region 71, the base region 6, and the gate protection region 4b is selectively removed so as to dig the gate trench 10 from the top surface of the source contact region 72 in the depth direction by dry etching such as RIE, as illustrated in FIG. 9.

The provision of the gate trench 10 divides the source expansion region 71 into the two source expansion regions 71a and 71b, divides the source contact region 72 into the two source contact regions 72a and 72b, and divides the base region 6 into the two base regions 6a and 6b. The source expansion region 71a and the source contact region 72a implement the source region 7a, and the source expansion region 71b and the source contact region 72b implement the source region 7b. The oxide film 22 used as the mask for etching is then removed. Instead of the oxide film 22, the photoresist film may be used as the mask for etching.

Next, the gate insulating film 11 (refer to FIG. 10) is formed along the bottom surface and the side surfaces of the gate trench 10 and the respective top surfaces of the source contact regions 72a and 72b and the base contact regions 5a and 5b by a method such as CVD, high temperature oxidation (HTO), and thermal oxidation. Upon the formation of the gate insulating film 11, heat treatment that is post deposition annealing (PDA) is executed at a temperature in a range of about 900° C. or higher and 1350° C. or lower, for example.

Figure 10:
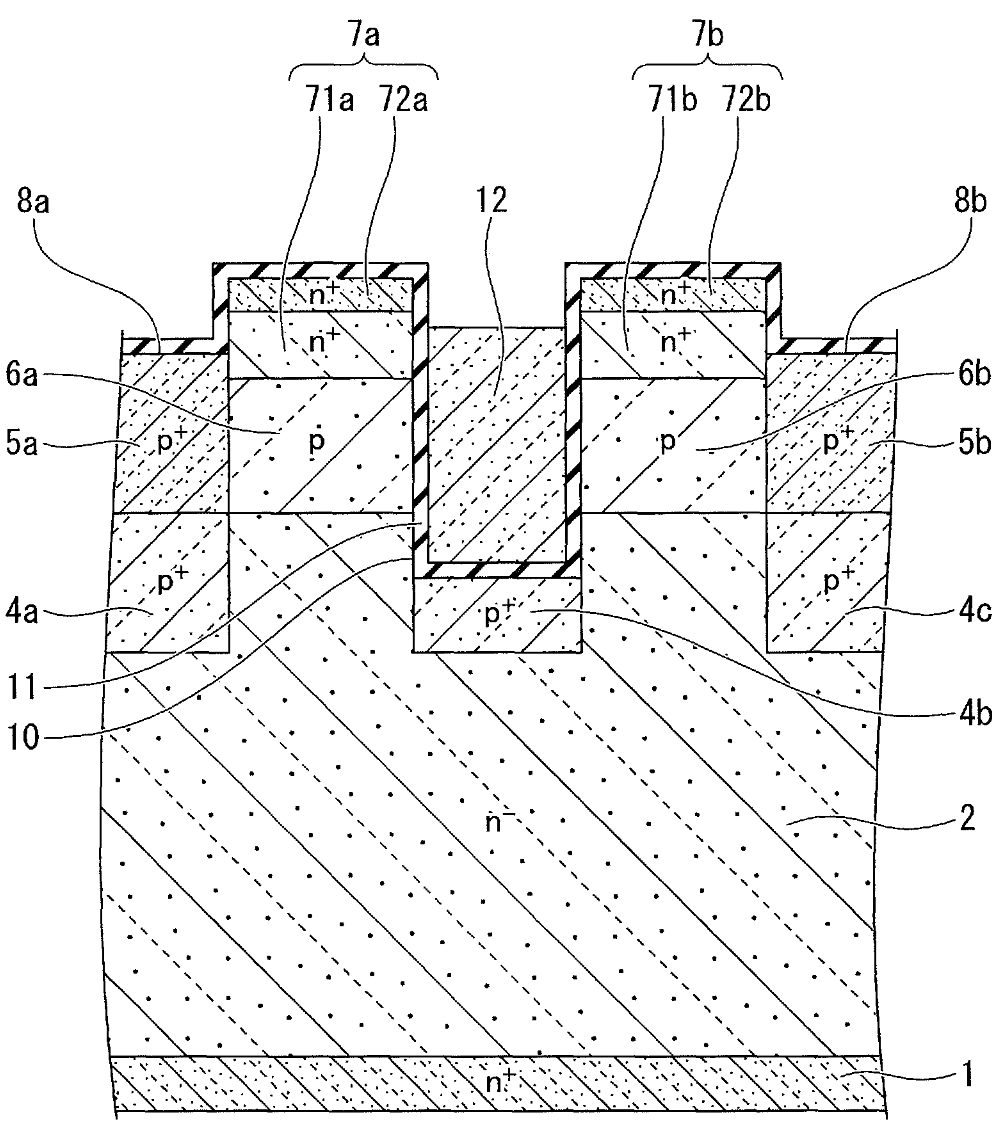
FIG. 10 is a schematic cross-sectional view continued from FIG. 9, for explaining the example of the method of manufacturing the silicon carbide semiconductor device according to the first embodiment.

Next, a polysilicon layer (a doped polysilicon layer) heavily doped with impurity ions such as phosphorus (P) or boron (B) is deposited so as to fill the inside of the gate trench 10 by CVD or the like. Apart of the polysilicon layer is then selectively removed by photolithography and dry etching. This step provides the insulated gate electrode structure (11, 12) implemented by the gate insulating film 11 and the gate electrode 12, as illustrated in FIG. 10. The drop amount of the gate electrode 12 may be adjusted at this point such that the top surface of the gate electrode 12 at the position in contact with the gate insulating film 11 is located to be deeper than the respective bottom surfaces of the source contact regions 72a and 72b and shallower than the respective bottom surfaces of the source expansion regions 71a and 71b.

Figure 11:
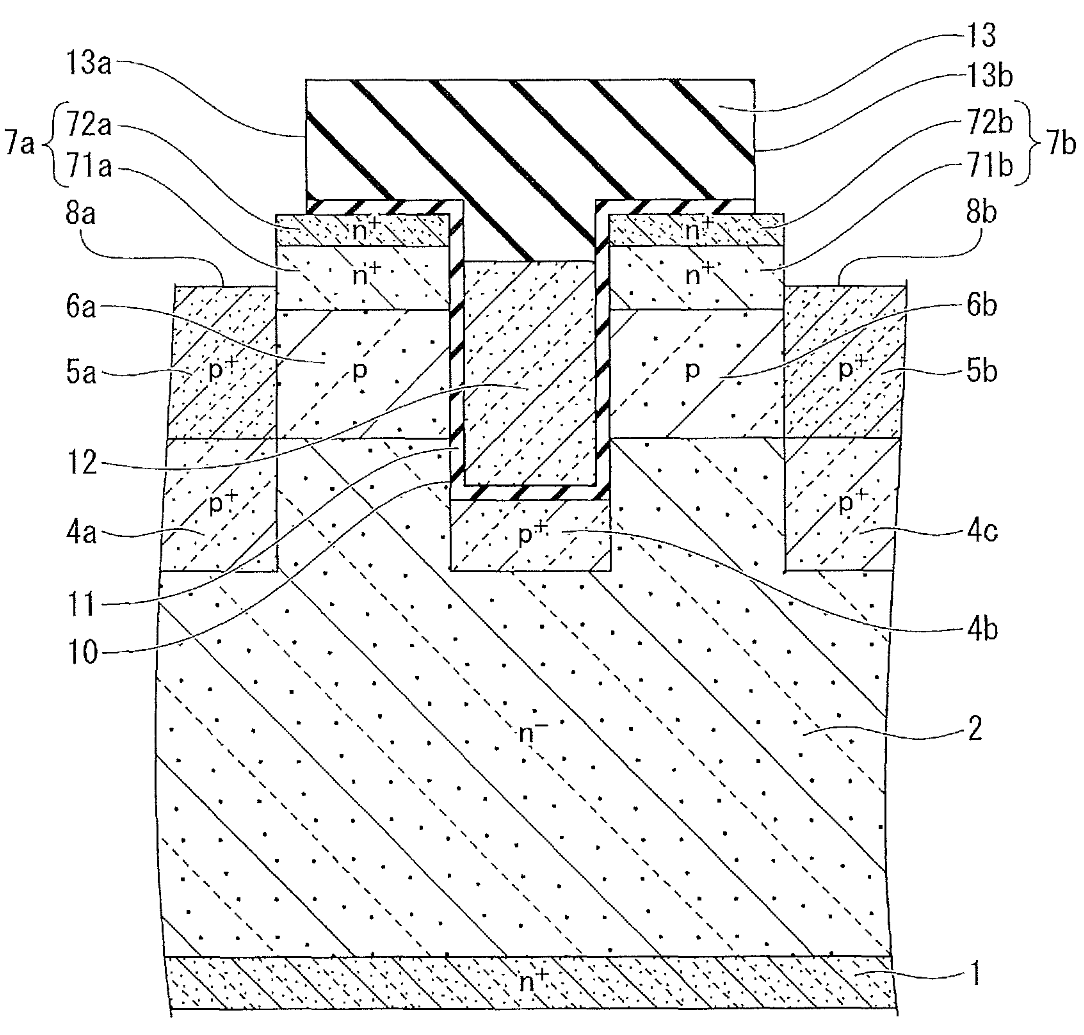
FIG. 11 is a schematic cross-sectional view continued from FIG. 10, for explaining the example of the method of manufacturing the silicon carbide semiconductor device according to the first embodiment.

Next, the interlayer insulating film 13 (refer to FIG. 11) is deposited on the top surface of the insulated gate electrode structure (11, 12) by CVD or the like. A part of the interlayer insulating film 13 and a part of the gate insulating film 11 are then selectively removed by photolithography and dry etching so as to open the contact holes 13a and 13b in the interlayer insulating film 13 to which a part of the respective top surfaces of the source contact regions 72a and 72b and the contact holes 8a and 8b are exposed, as illustrated in FIG. 11. This step may be followed by heat treatment (reflowing) for flattening the interlayer insulating film 13.

Next, the silicide layer 16 (refer to FIG. 12) is deposited by sputtering or vapor deposition and annealing, for example, and a part of the silicide layer 16 is then selectively removed by photolithography and dry etching. This step selectively forms the silicide layer 16 on the respective top surfaces of the base contact regions 5a and 5b exposed to the bottom surfaces of the contact trenches 8a and 8b. The silicide layer 16 is to be in ohmic contact with the base contact regions 5a and 5b at a low resistance.

Figure 12:
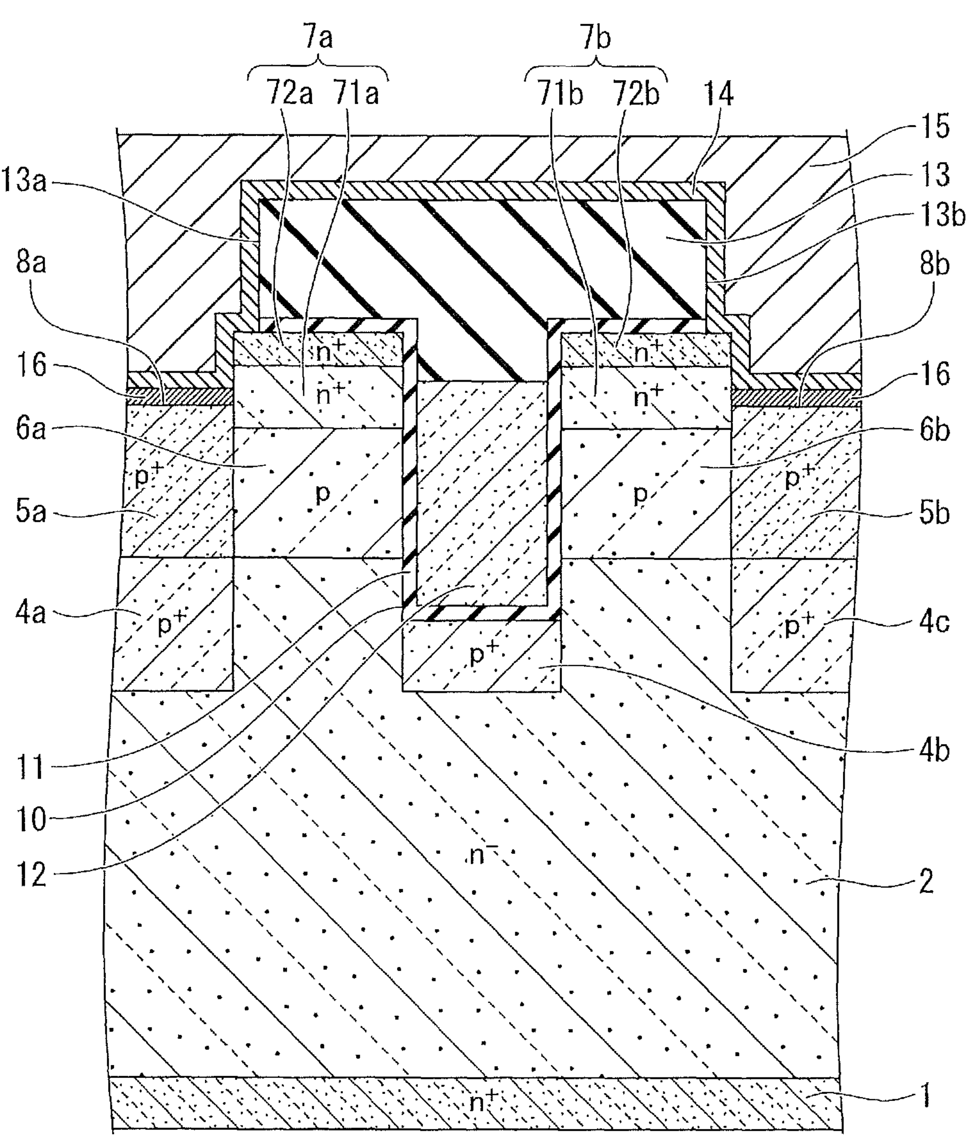
FIG. 12 is a schematic cross-sectional view continued from FIG. 11, for explaining the example of the method of manufacturing the silicon carbide semiconductor device according to the first embodiment.

Next, the barrier metal layer 14 and the source wiring layer 15 are sequentially formed to fill the respective contact trenches 8a and 8b and further cover the respective top surfaces of the source contact regions 72a and 72b and the interlayer insulating film 13 by sputtering or vapor deposition, for example, as illustrated in FIG. 12. This step provides the source electrode (14, 15, 16) implemented by the barrier metal layer 14, the source wiring layer 15, and the silicide layer 16. The barrier metal layer 14 is to be in ohmic contact with a part of the top surfaces and also the side surfaces of the source contact regions 72a and 72b at a low resistance.

While the present embodiment is illustrated with the case in which the source contact regions 72a and 72b and the base contact regions 5a and 5b are each connected to the source electrode (14, 15, 16) through the contact holes 13*a* and 13*b*, the source contact regions 72*a* and 72*b* and the base contact regions 5*a* and 5*b* may be connected to the source electrode (14, 15, 16) through different contact holes independently of each other.

Next, the SiC substrate 1 is ground from the bottom surface side by grinding or chemical mechanical polishing (CMP) or the like to adjust the thickness as necessary so as to lead to the drain region 1. Thereafter, the drain electrode 17 (refer to FIG. 1) including gold (Au) is formed on the entire bottom surface of the drain region 1 by sputtering or vapor deposition, for example. The silicon carbide semiconductor device illustrated in FIG. 1 is thus completed.

A method of manufacturing a semiconductor device of a comparative example is described below. The method of manufacturing the semiconductor device of the comparative example rationally uses a difference between the impurity concentration set for satisfying a contact resistance required for the source contact regions 72*a* and 72*b* and the impurity concentration set for satisfying a contact resistance required for the base contact regions 5*a* and 5*b*, and then inverts (turns back) the conductivity of a part of the n-type region to the p-type so as to form the base contact regions 5*a* and 5*b* after the execution of the step of forming the source contact region 72.

Figure 13:
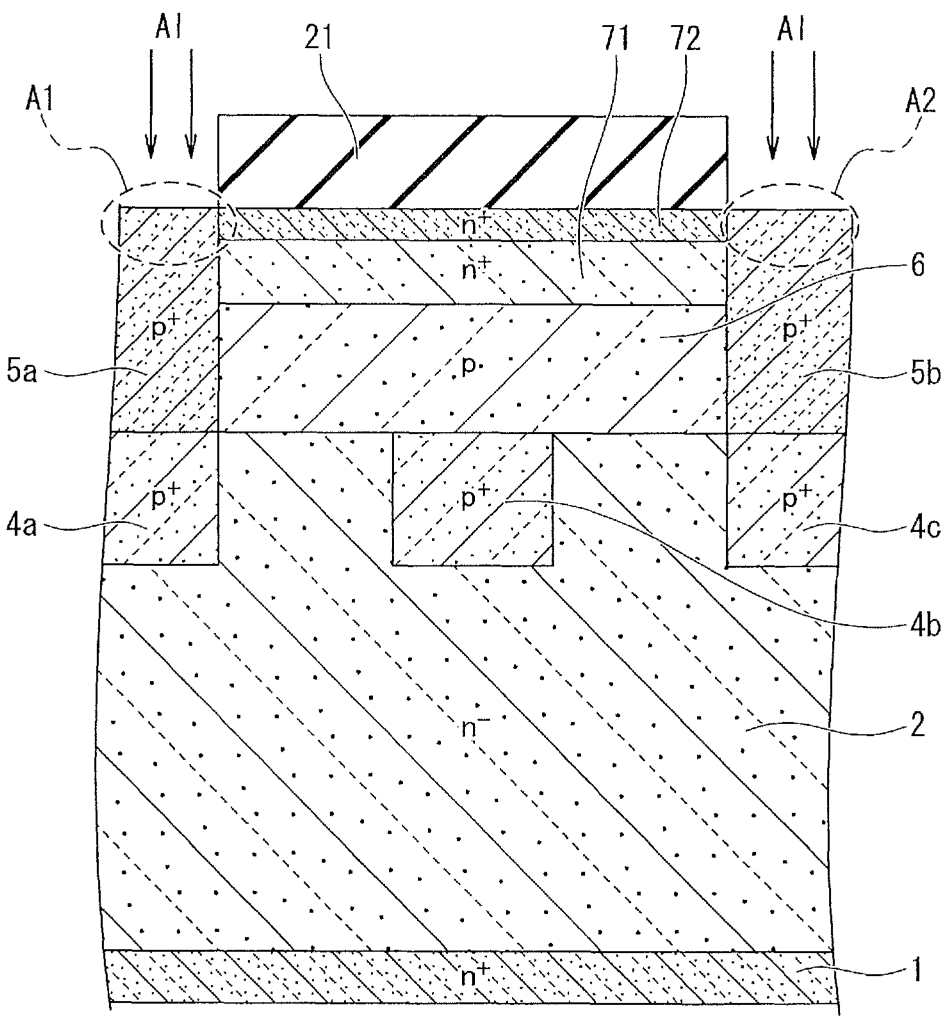
FIG. 13 is a schematic cross-sectional view for explaining a method of manufacturing a silicon carbide semiconductor device of a comparative example.

More particularly, the method of manufacturing the semiconductor device of the comparative example includes a process of forming the source contact region 72 illustrated in FIG. 6, and then depositing the oxide film 21 (refer to FIG. 13) on the top surface of the source contact region 72 so as to delineate the deposited oxide film 21. Using the delineated oxide film 21 as a mask for ion implantation, p-type impurity ions such as aluminum (Al) are selectively implanted so as to invert (turn back) the conductivity of a part of the source expansion region 71 and the source contact region 72 from the n-type to the p-type, as illustrated in FIG. 13. This step selectively forms the $p^+$-type base contact regions 5*a* and 5*b* on the top surface side of the buried regions 4*a* and 4*c*.

The method of manufacturing the semiconductor device of the comparative example, however, may cause a leakage defect at the turned-back part of the source contact region 72 corresponding to the respective regions A1 and A2 indicated by the broken lines in FIG. 13. The reason for this is presumed to be that the ion implantation for forming the source contact region 72 and the ion implantation for forming the base contact regions 5*a* and 5*b* cause a lot of damage to lead the upper parts of the base contact regions 5*a* and 5*b* to turn to 3C-SiC, leading to a source of leakage accordingly.

In contrast, the method of manufacturing the silicon carbide semiconductor device according to the first embodiment selectively removes a part of each of the source expansion region 71 and the source contact region 72 so as to form the contact trenches 8*a* and 8*b*, as illustrated in FIG. 7. The manufacturing method then implants the p-type impurity ions to the respective bottom surfaces of the contact trenches 8*a* and 8*b*, so as to turn back a part of the source expansion region 71 to form the base contact regions 5*a* and 5*b* without the turnback of the source contact region 72, as illustrated in FIG. 8. This manufacturing method thus can eliminate the provision of the regions overlapped upon the ion implantation for forming the source contact region 72 and the ion implantation for forming the base contact regions 5*a* and 5*b*, so as to lead the crystal structure of the base contact regions 5*a* and 5*b* to turn to 4H-SiC without destruction, avoiding a leakage defect accordingly.

Further, the manufacturing method, when executing the implantation of the p-type impurity ions illustrated in FIG. 8 first and then forming the contact trenches 8*a* and 8*b* illustrated in FIG. 7, can cut down the upper parts of the base contact regions 5*a* and 5*b* having a lot of damage due to the implantation of the p-type impurity ion during the formation of the contact trenches 8*a* and 8*b*. This leads the remaining crystal structure of the base contact regions 5*a* and 5*b* to turn to 4H-SiC, further avoiding a leakage defect accordingly.

Further, the method of manufacturing the silicon carbide semiconductor device according to the first embodiment can use the oxide film 21 commonly as the mask for etching upon the formation of the contact trenches 8*a* and 8*b* and the mask for ion implantation upon the formation of the base contact regions 5*a* and 5*b*. The manufacturing method thus does not need to take account of the positioning accuracy, so as to reliably avoid the provision of the regions overlapped upon the ion implantation for forming the source contact region 72 and the ion implantation for forming the base contact regions 5*a* and 5*b*. This manufacturing method can further decrease the manufacturing steps and thus reduce the manufacturing costs, as compared with a case of forming the source contact region 72 and the base contact regions 5*a* and 5*b* by use of different masks so as not to provide the regions overlapped upon the ion implantation for forming the source contact region 72 and the ion implantation for forming the base contact regions 5*a* and 5*b*.

Second Embodiment

<Structure of Silicon Carbide Semiconductor Device>

Figure 14:
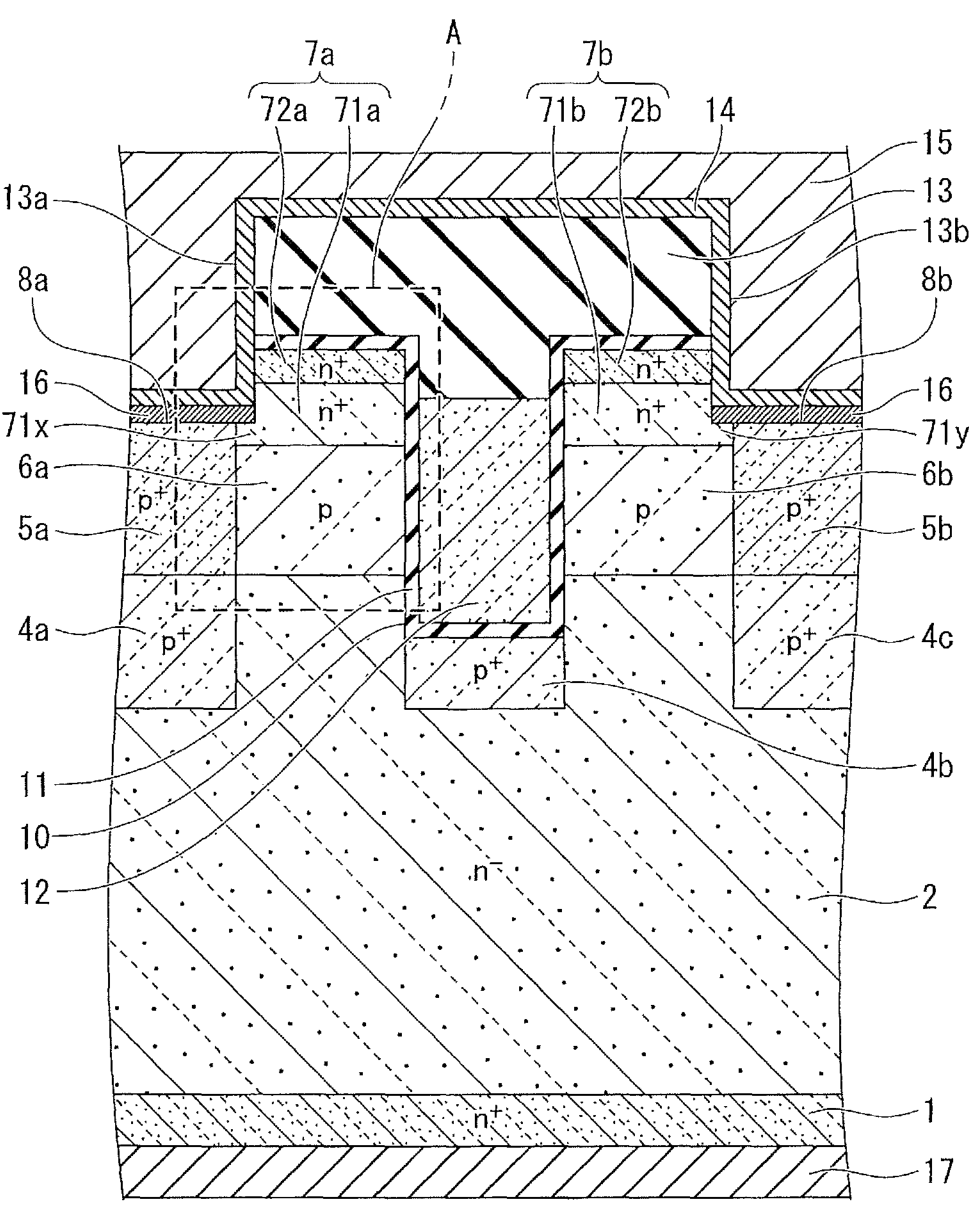
FIG. 14 is a schematic cross-sectional view illustrating an example of a silicon carbide semiconductor device according to a second embodiment.

A silicon carbide semiconductor device according to a second embodiment differs from the silicon carbide semiconductor device according to the first embodiment illustrated in FIG. 1 in that the contact holes 13*a* and 13*b* of the interlayer insulating film 13 and the contact trenches 8*a* and 8*b* are provided to have continuous side surfaces, as illustrated in FIG. 14. The base contact regions 5*a* and 5*b* have a narrower width than the contact trenches 8*a* and 8*b*. The side surfaces of the source expansion regions 71*a* and 71*b* at the lower parts in contact with the contact trenches 8*a* and 8*b* are provided with stepped parts 71*x* and 71*y*.

Figure 15:
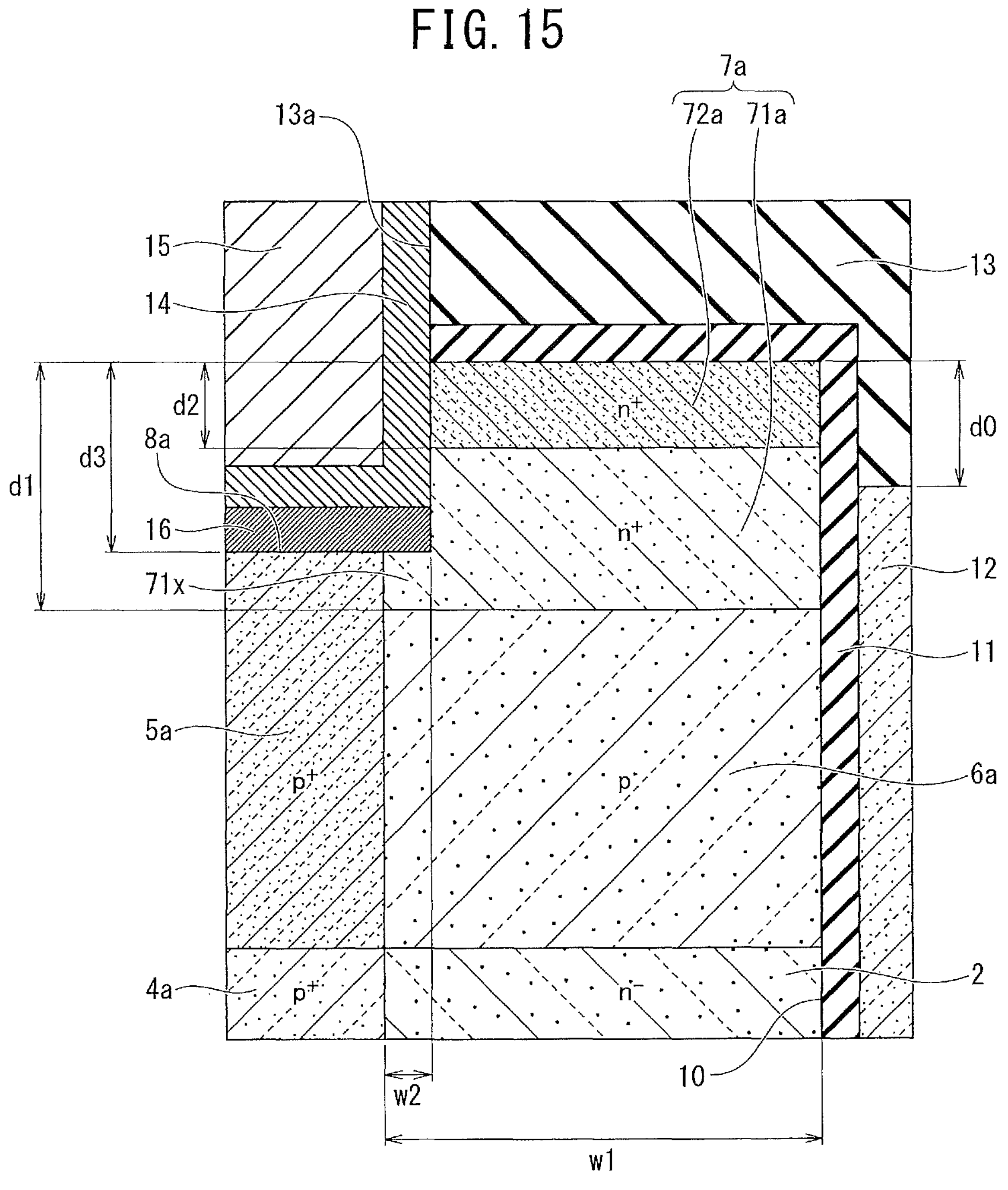
FIG. 15 is a schematic enlarged cross-sectional view of region A in FIG. 14.

FIG. 15 is a schematic enlarged cross-sectional view of region A indicated by the broken line illustrated in FIG. 14. The stepped part 71*x* is provided at the lower part of the side surface of the source expansion region 71*a* on the left side. A width w2 of the stepped part 71*x* is in a range of 10 nanometers or greater and 300 nanometers or smaller, for example. The side surface of the stepped part 71*x* is in contact with the base contact region 5*a*. The top surface of the stepped part 71*x* is in contact with the bottom surface of the contact trench 8*a* and the silicide layer 16. Arranging the silicide layer 16 to be in contact with not only the respective top surfaces of the base contact regions 5*a* and 5*b* but also the stepped parts 71*x* and 71*y* of the source contact regions 71*a* and 71*b* can avoid a variation in ohmic contact area of the base contact regions 5*a* and 5*b*.

The side surface of the source expansion region 71*a* on the left side located above the stepped part 71*x* is in contact with the side surface of the contact trench 8*a*, the silicide layer 16, and the barrier metal layer 14. The side surface of the source contact region 72*a* on the left side is in contact with the side surface of the contact trench 8*a* and the barrier metal layer 14. The top surface of the source contact region 72*a* is not in contact with the barrier metal layer 14, but is covered with the gate insulating film 11 and the interlayer insulating film 13.

The source expansion region 71*b* and the source contact region 72*b* of the source region 7*b* illustrated in FIG. 14 have substantially the same configurations as the source expansion region 71*a* and the source contact region 72*a* of the source region 7*a*, and overlapping explanations are not repeated below.

The positional relation between the source expansion region 71*b* and the source contact region 72*b* of the source region 7*b*, the base contact region 5*b*, the gate insulating film 11, and the gate electrode 12 is also common to that between the source expansion region 71*a* and the source contact region 72*a* of the source region 7*a*, the base contact region 5*a*, the gate insulating film 11, and the gate electrode 12 illustrated in FIG. 15, and overlapping explanations are not repeated below. The other configurations of the silicon carbide semiconductor device according to the second embodiment are substantially the same as those of the silicon carbide semiconductor device according to the first embodiment, and overlapping explanations are not repeated below.

The silicon carbide semiconductor device according to the second embodiment has the configuration that can lead the source contact regions 72*a* and 72*b* of the source regions 7*a* and 7*b* including 3C-SiC to be in ohmic contact with the source electrode (14, 15, 16) at a low resistance without the silicide layer 16 interposed. This configuration can eliminate a problem of separation of the silicide layer 16 since the silicide layer 16 does not need to be provided on the contact joint surface of the respective source contact regions 72*a* and 72*b*. Further, the ohmic contact with the source electrode (14, 15, 16) can be achieved only by the side surfaces of the source contact regions 72*a* and 72*b*, so as to facilitate the minimization of the unit cell in the lateral direction.

Further, the silicon carbide semiconductor device according to the second embodiment has the configuration in which the contact trenches 8*a* and 8*b* have the deeper bottom surface than the source contact regions 72*a* and 72*b* so as not to lead the source contact regions 72*a* and 72*b* including 3C-SiC to be in contact with the base contact regions 5*a* and 5*b* including 4H-SiC. This configuration can exclude damage derived from the ion implantation for the source expansion regions 71*a* and 71*b* to be formed in the base contact regions 5*a* and 5*b*, so as to avoid a leakage defect accordingly, as compared with a case in which the source contact regions 72*a* and 72*b* and the base contact regions 5*a* and 5*b* are in contact with each other without the contact trenches 8*a* and 8*b* provided.

Further, the silicon carbide semiconductor device according to the second embodiment has the configuration in which the respective source expansion regions 71*a* and 71*b* and the respective base contact regions 5*a* and 5*b* implementing the p-n junction both include 4H-SiC, so as to avoid a leak current at the p-n junction part, as compared with a case in which the p-n junction is implemented by the source contact regions 72*a* and 72*b* including 3C-SiC with a large amount of crystal defects remaining and the base contact regions 5*a* and 5*b* including 4H-SiC.

Further, the silicon carbide semiconductor device according to the second embodiment has the configuration in which the top surface of the gate electrode 12 is located at a position deeper than the bottom surface of the source contact region 72*a* and shallower than the bottom surface of the source expansion region 71*a*. This configuration leads the source expansion region 71*a* of the source region 7*a* having a relatively small amount of crystal defects with less surface roughness to be opposed to the gate electrode 12 with the gate insulating film 11 interposed, while the source contact region 72*a* of the source region 7*a* having a relatively large amount of crystal defects with larger surface roughness is not opposed to the gate electrode 12. The configuration according to the second embodiment thus can suppress a cause of a leak current between the source region 7*a* and the gate electrode 12.

<Method of Manufacturing Silicon Carbide Semiconductor Device>

A method of manufacturing the silicon carbide semiconductor device according to the second embodiment has substantially the same process as the method of manufacturing the silicon carbide semiconductor device according to the first embodiment, but includes different steps after the step of forming the source contact region 72 illustrated in FIG. 6.

The method of manufacturing the silicon carbide semiconductor device according to the second embodiment after the step illustrated in FIG. 6 then delineates the oxide film 21 on the top surface of the base region 6, and selectively implants p-type impurity ions such as aluminum (Al) while using the delineated oxide film 21 as a mask for ion implantation so as to invert (turn back) the conductivity of a part of each of the source expansion region 71 and the source contact region 72 from the n-type to the p-type without the contact trenches 8*a* and 8*b* formed, as illustrated in FIG. 13. This step selectively forms the $p^+$-type base contact regions 5*a* and 5*b* on the top surface side of the buried regions 4*a* and 4*c*. A lot of damage is caused to the parts corresponding to the regions A1 and A2 indicated by the broken lines in FIG. 13 that are the turned-back parts of the source contact region 72.

Next, activation annealing (heat treatment) is executed by use of an annealing furnace or the like at a temperature in a range of about 1600° C. or higher and 1900° C. or lower, for example, so as to collectively activate the p-type impurity ions or the n-type impurity ions implanted into the buried regions 4*a* and 4*c*, the gate protection region 4*b*, the source expansion region 71, the source contact region 72, the base contact regions 5*a* and 5*b*, and the like. At this point, the amorphous structure in the source contact region 72 is recrystallized to turn to 3C-SiC, so as to form the source contact region 72 including 3C-SiC. The turned-back parts of the source contact region 72 at the upper part of the respective base contact regions 5*a* and 5*b* also turn to 3C-SiC.

Figure 16:
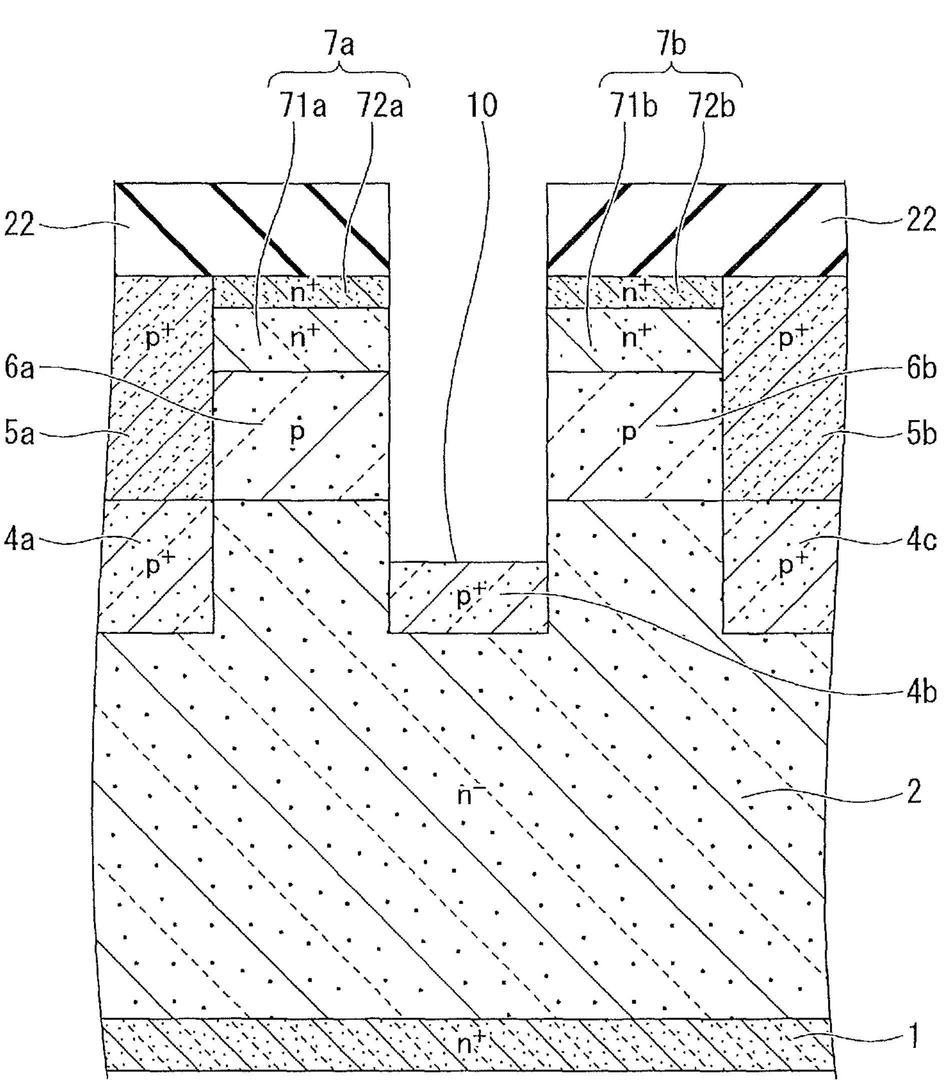
FIG. 16 is a schematic cross-sectional view for explaining an example of a method of manufacturing the silicon carbide semiconductor device according to the second embodiment.

Next, an oxide film 22 (refer to FIG. 16) is deposited on the respective top surfaces of the source contact region 72 and the base contact regions 5*a* and 5*b* by CVD or the like. A photoresist film is then applied to the top surface of the oxide film 22, and the oxide film 22 is delineated by photolithography and dry etching. Using the delineated oxide film 22 as a mask for etching, a part of each of the source contact region 72, the source expansion region 71, the base region 6, and the gate protection region 4*b* is selectively removed so as to dig the gate trench 10 from the top surface of the source contact region 72 in the depth direction by dry etching such as RIE, as illustrated in FIG. 16. Instead of the oxide film 22, the photoresist film may be used as the mask for etching. The oxide film 22 used as the mask for etching is then removed.

Next, the gate insulating film 11 (refer to FIG. 17) is formed along the bottom surface and the side surfaces of the gate trench 10 and the respective top surfaces of the source contact regions 72*a* and 72*b* and the base contact regions 5*a* and 5*b* by a method such as CVD, high temperature oxidation (HTO), and thermal oxidation.

Figure 17:
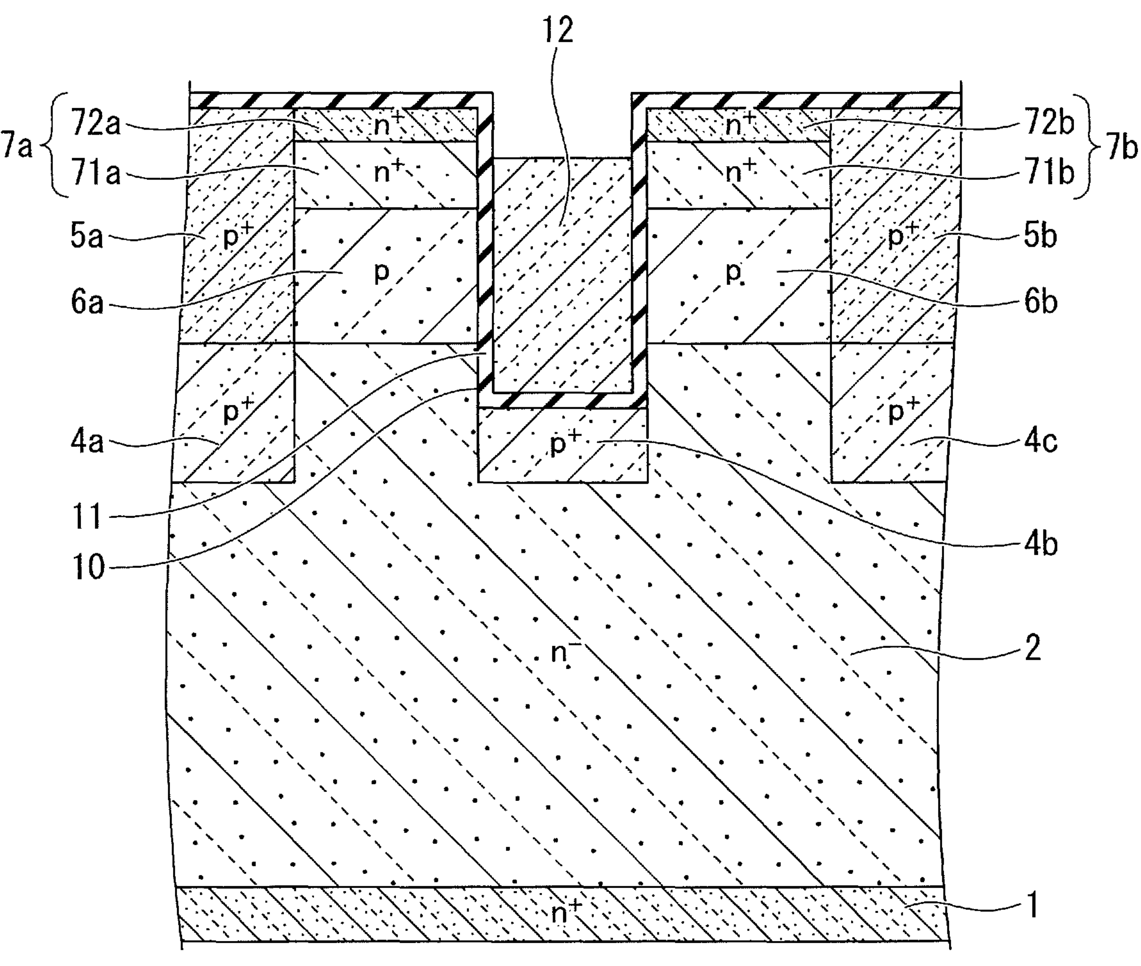
FIG. 17 is a schematic cross-sectional view continued from FIG. 16, for explaining the example of the method of manufacturing the silicon carbide semiconductor device according to the second embodiment.

Next, a polysilicon layer (a doped polysilicon layer) heavily doped with impurity ions such as phosphorus (P) or boron (B) is deposited so as to fill the inside of the gate trench 10 with the gate insulating film 11 interposed by CVD or the like. Apart of the polysilicon layer is then selectively removed by photolithography and dry etching. This step provides the insulated gate electrode structure (11, 12) implemented by the gate insulating film 11 and the gate electrode 12, as illustrated in FIG. 17.

Figure 18:
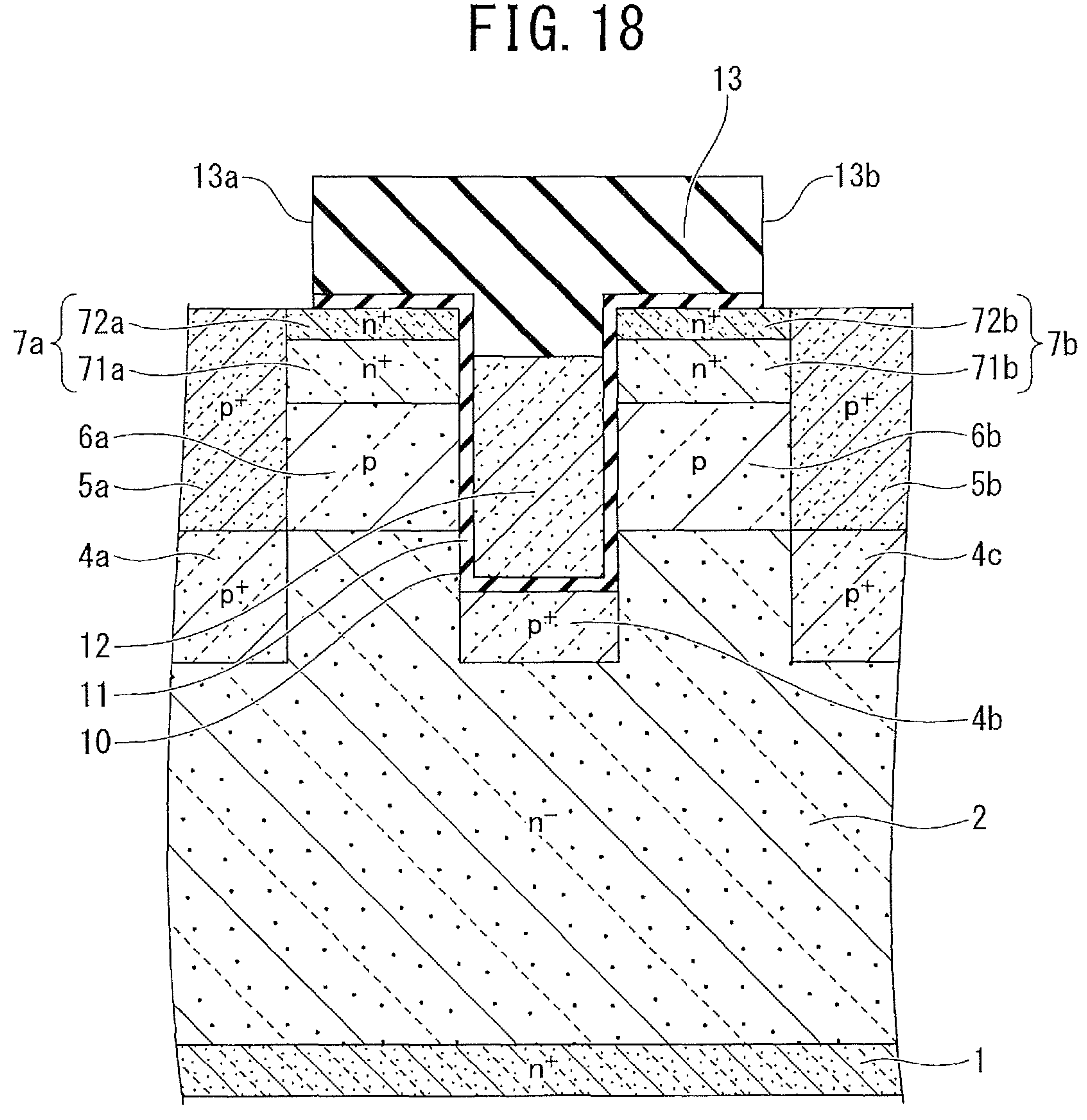
FIG. 18 is a schematic cross-sectional view continued from FIG. 17, for explaining the example of the method of manufacturing the silicon carbide semiconductor device according to the second embodiment.

Next, the interlayer insulating film 13 (refer to FIG. 18) is deposited on the respective top surfaces of the insulated gate electrode structure (11, 12), the source contact regions 72*a* and 72*b*, and the base contact regions 5*a* and 5*b* by CVD or the like. Apart of the interlayer insulating film 13 and a part of the gate insulating film 11 are then selectively removed by photolithography and dry etching. This step opens the contact holes 13*a* and 13*b* in the interlayer insulating film 13 to which a part of the respective top surfaces of the source contact regions 72*a* and 72*b* and the respective top surfaces of the base contact regions 5*a* and 5*b* are exposed, as illustrated in FIG. 18.

Figure 19:
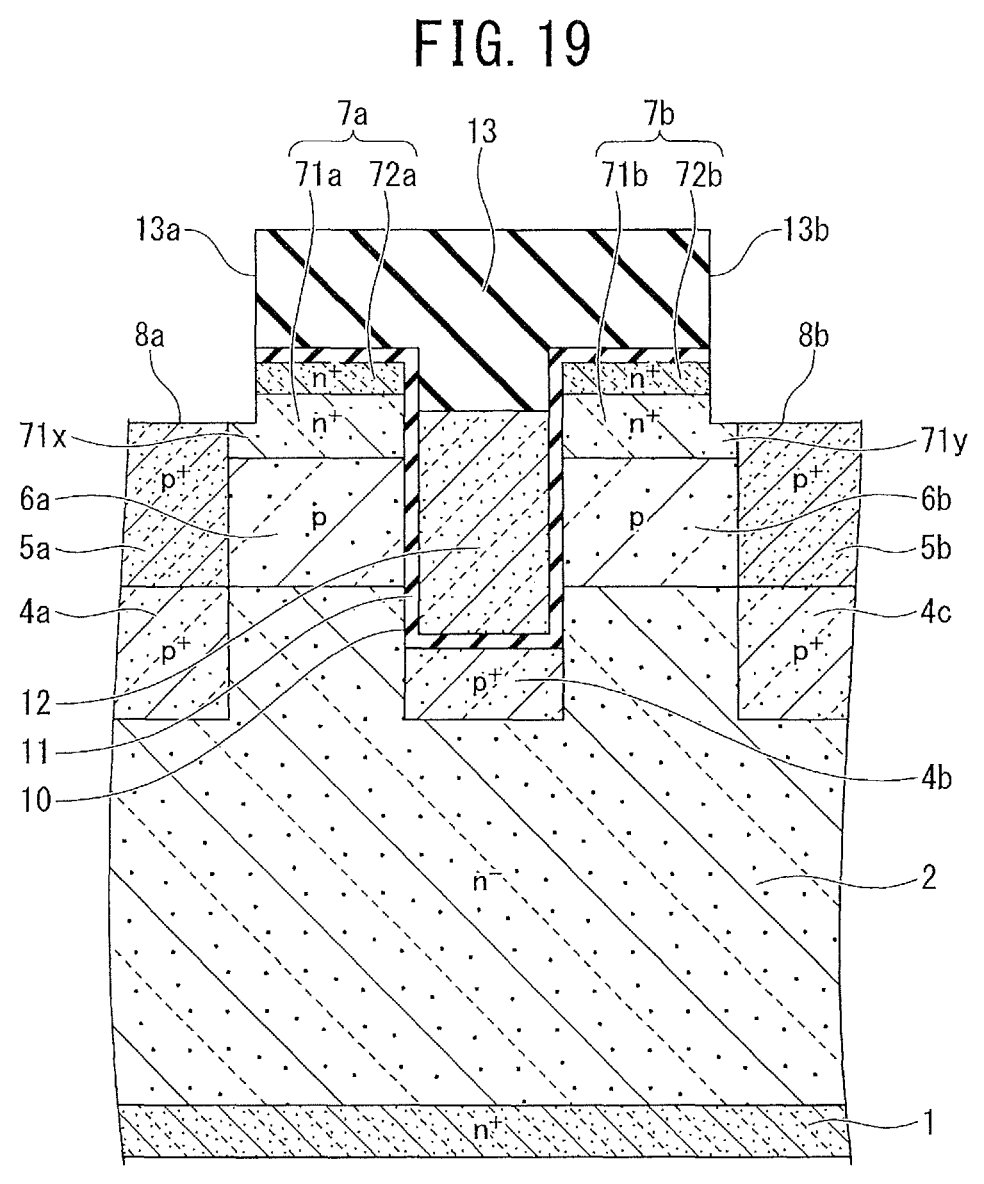

Next, using the interlayer insulating film 13 as a mask for etching, a part of each of the source contact region 72, the source expansion region 71, and the base contact regions 5*a* and 5*b* located over the buried regions 4*a* and 4*c* is selectively removed by dry etching such as RIE, as illustrated in FIG. 19. This step provides the contact trenches 8*a* and 8*b* having a wider width than the base contact regions 5*a* and 5*b* in a self-aligned manner. This step also cuts down the part of the respective base contact regions 5*a* and 5*b* including 3C-SiC on the upper side, while leading the part of the respective base contact regions 5*a* and 5*b* including 4H-SiC to remain.

The contact trenches 8*a* and 8*b* are provided to have the deeper bottom surfaces than the source contact regions 72*a* and 72*b*. The source expansion regions 71*a* and 71*b* are provided with the stepped parts 71*x* and 71*y*, respectively. The base contact regions 5*a* and 5*b* and the stepped parts 71*x* and 71*y* of the source expansion regions 71*a* and 71*b* are exposed to the respective bottom surfaces of the contact trenches 8*a* and 8*b*. The source expansion regions 71*a* and 71*b* and the source contact regions 72*a* and 72*b* are exposed to the side surfaces of the contact trenches 8*a* and 8*b*. This step may be followed by heat treatment (reflowing) for flattening the interlayer insulating film 13.

The other steps of the method of manufacturing the silicon carbide semiconductor device according to the second embodiment are substantially the same as those of the method of manufacturing the silicon carbide semiconductor device according to the first embodiment, and overlapping explanations are not repeated below.

The method of manufacturing the silicon carbide semiconductor device according to the second embodiment turns back the source expansion region 71 and the source contact region 72 to form the base contact regions 5*a* and 5*b* as illustrated in FIG. 13, and then selectively cuts down the part of the respective base contact regions 5*a* and 5*b* including 3C-SiC in which the source contact region 72 is turned back so as to form the contact trenches 8*a* and 8*b*, as illustrated in FIG. 19. The manufacturing method according to the second embodiment can keep only the part of the respective base contact regions 5*a* and 5*b* including 4H-SiC, so as to avoid a leakage defect accordingly.

Further, the method of manufacturing the silicon carbide semiconductor device according to the second embodiment can form the contact trenches 8*a* and 8*b* in a self-aligned manner while using the interlayer insulating film 13 as the mask for etching. The manufacturing method thus does not need to take account of the positioning accuracy, so as to reliably cut down the part of the respective base contact regions 5*a* and 5*b* including 3C-SiC in which the source contact region 72 is turned back. This manufacturing method can further decrease the manufacturing steps and thus reduce the manufacturing costs, as compared with a case of forming the source contact region 72 and the base contact regions 5*a* and 5*b* by use of different masks so as not to provide the regions overlapped upon the ion implantation for forming the source contact region 72 and the ion implantation for forming the base contact regions 5*a* and 5*b*.

Third Embodiment

Figure 20:
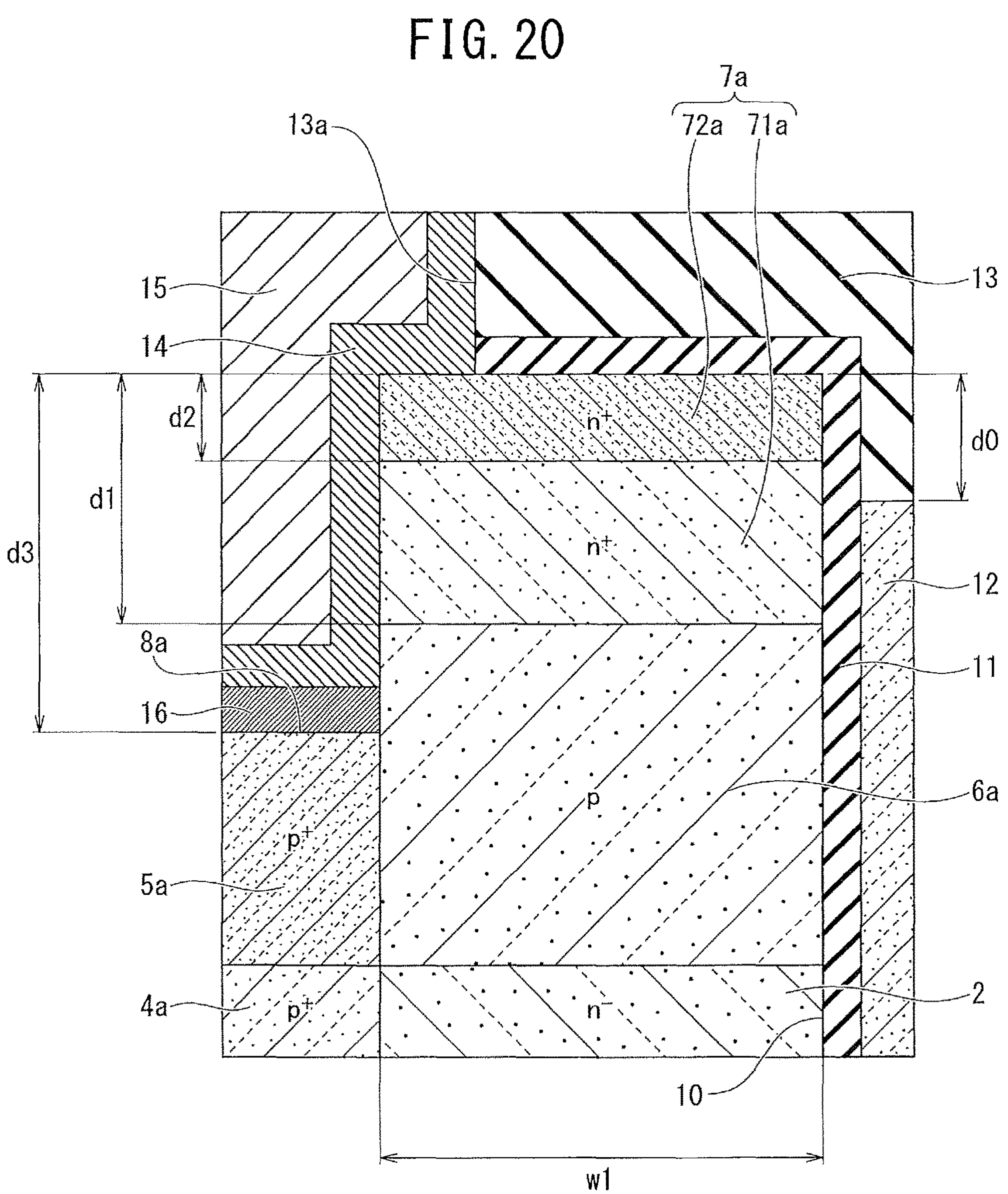
FIG. 20 is a schematic cross-sectional view illustrating an example of a silicon carbide semiconductor device according to a third embodiment.

FIG. 20 is a cross-sectional view illustrating a silicon carbide semiconductor device according to a third embodiment at a position corresponding to the cross section of the silicon carbide semiconductor device according to the first embodiment illustrated in FIG. 2. As illustrated in FIG. 20, the silicon carbide semiconductor device according to the third embodiment differs from the silicon carbide semiconductor device according to the first embodiment illustrated in FIG. 2 in that the bottom surface of the contact trench 8*a* is located at a position deeper than the bottom surface of the source expansion region 71*a*. The depth d3 of the contact trench 8*a* from the top surface of the source contact region 72*a* is greater than the depth d1 of the source expansion region 71*a* from the top surface of the source contact region 72*a*. A part of the side surface of the base region 6*a* on the left side is in contact with the side surface of the contact trench 8*a*, the silicide layer 16, and the barrier metal layer 14.

Although not illustrated, the bottom surface of the other contact trench 8*b* (refer to FIG. 1) is also located at a position deeper than the bottom surface of the source expansion region 71*b* (refer to FIG. 1). The other configurations of the silicon carbide semiconductor device according to the third embodiment are substantially the same as those of the silicon carbide semiconductor device according to the first embodiment, and overlapping explanations are not repeated below.

The silicon carbide semiconductor device according to the third embodiment, which has the configuration in which the contact trenches 8*a* and 8*b* have the deeper bottom surfaces than the source expansion regions 71*a* and 71*b*, can also lead the source contact regions 72*a* and 72*b* including 3C-SiC to be in ohmic contact with the source electrode (14, 15, 16) without the silicide layer 16 interposed, and can further avoid a leakage defect since the base contact regions 5*a* and 5*b* including 4H-SiC are not in contact with the source contact regions 72*a* and 72*b* including 3C-SiC, as in the case of the silicon carbide semiconductor device according to the first embodiment.

Fourth Embodiment

Figure 21:
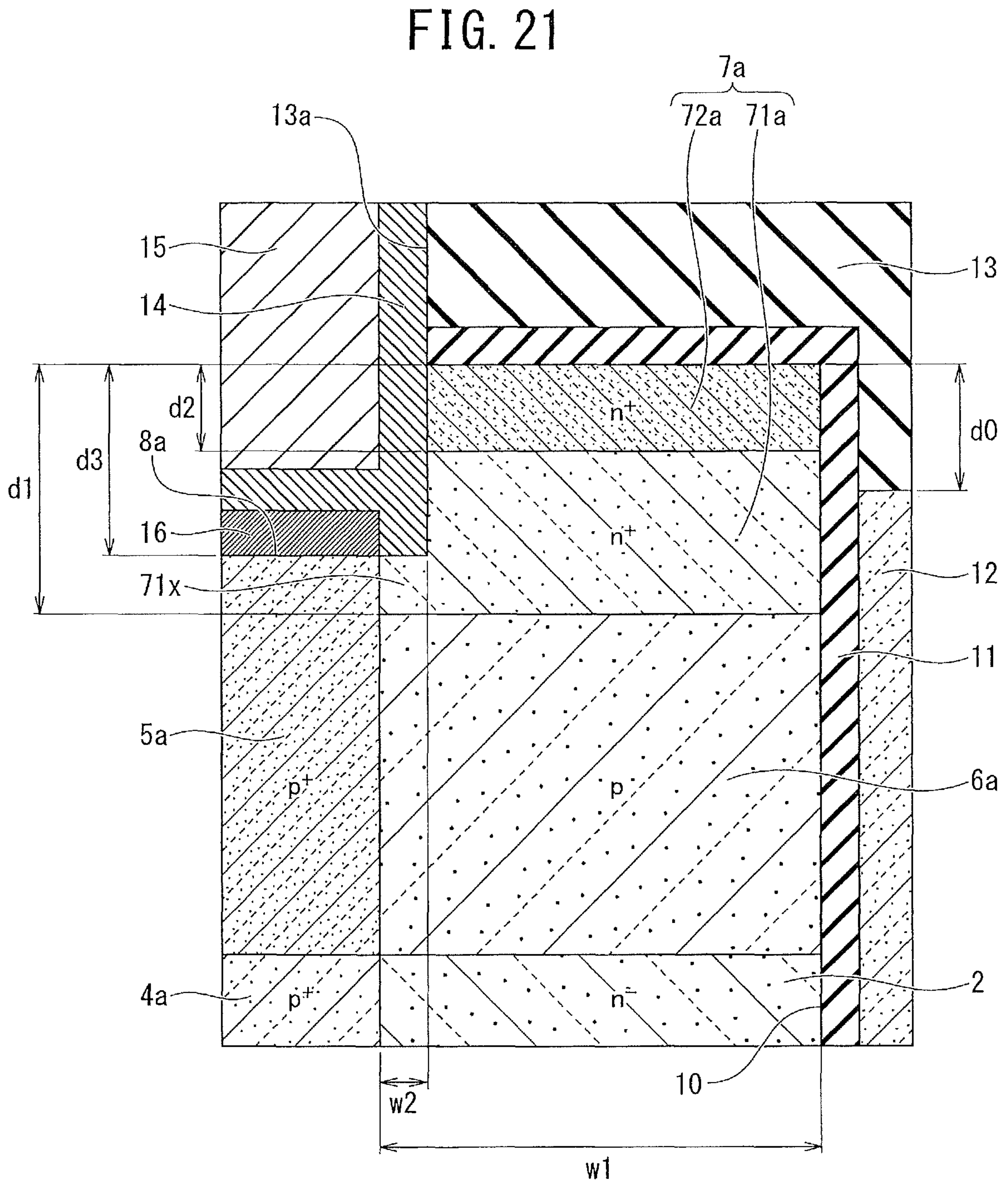
FIG. 21 is a schematic cross-sectional view illustrating an example of a silicon carbide semiconductor device according to a fourth embodiment.

FIG. 21 is a cross-sectional view illustrating a silicon carbide semiconductor device according to a fourth embodiment at a position corresponding to the cross section of the silicon carbide semiconductor device according to the second embodiment illustrated in FIG. 15. As illustrated in FIG. 21, the silicon carbide semiconductor device according to the fourth embodiment differs from the silicon carbide semiconductor device according to the second embodiment illustrated in FIG. 15 in that the silicide layer 16 is selectively deposited only on the top surface of the base contact region 5*a* under the contact trench 8*a*, but is not provided on the top surface of the stepped part 71*x* of the source expansion region 71*a*.

Although not illustrated, the silicide layer 16 is also selectively deposited only on the top surface of the base contact region 5*b* under the other contact trench 8*b* (refer to FIG. 14), but is not provided on the top surface of the stepped part 71*y* of the source expansion region 71*b*. The other configurations of the silicon carbide semiconductor device according to the fourth embodiment are substantially the same as those of the silicon carbide semiconductor device according to the second embodiment, and overlapping explanations are not repeated below.

The silicon carbide semiconductor device according to the fourth embodiment can also lead the source contact regions 72*a* and 72*b* including 3C-SiC to be in ohmic contact with the source electrode (14, 15, 16) without the silicide layer 16 interposed, and can further avoid a leakage defect since the base contact regions 5*a* and 5*b* including 4H-SiC are not in contact with the source contact regions 72*a* and 72*b* including 3C-SiC, as in the case of the silicon carbide semiconductor device according to the second embodiment.

Further, the silicon carbide semiconductor device according to the fourth embodiment, which has the configuration in which the silicide layer 16 is selectively deposited only on the respective top surfaces of the base contact regions 5*a* and 5*b* under the contact trenches 8*a* and 8*b*, but is not provided on the respective top surfaces of the stepped parts 71*x* and 71*y* of the source expansion regions 71*a* and 71*b*, can eliminate a problem of separation of the silicide layer 16 from the respective top surfaces of the stepped parts 71*x* and 71*y*.

Fifth Embodiment

Figure 22:
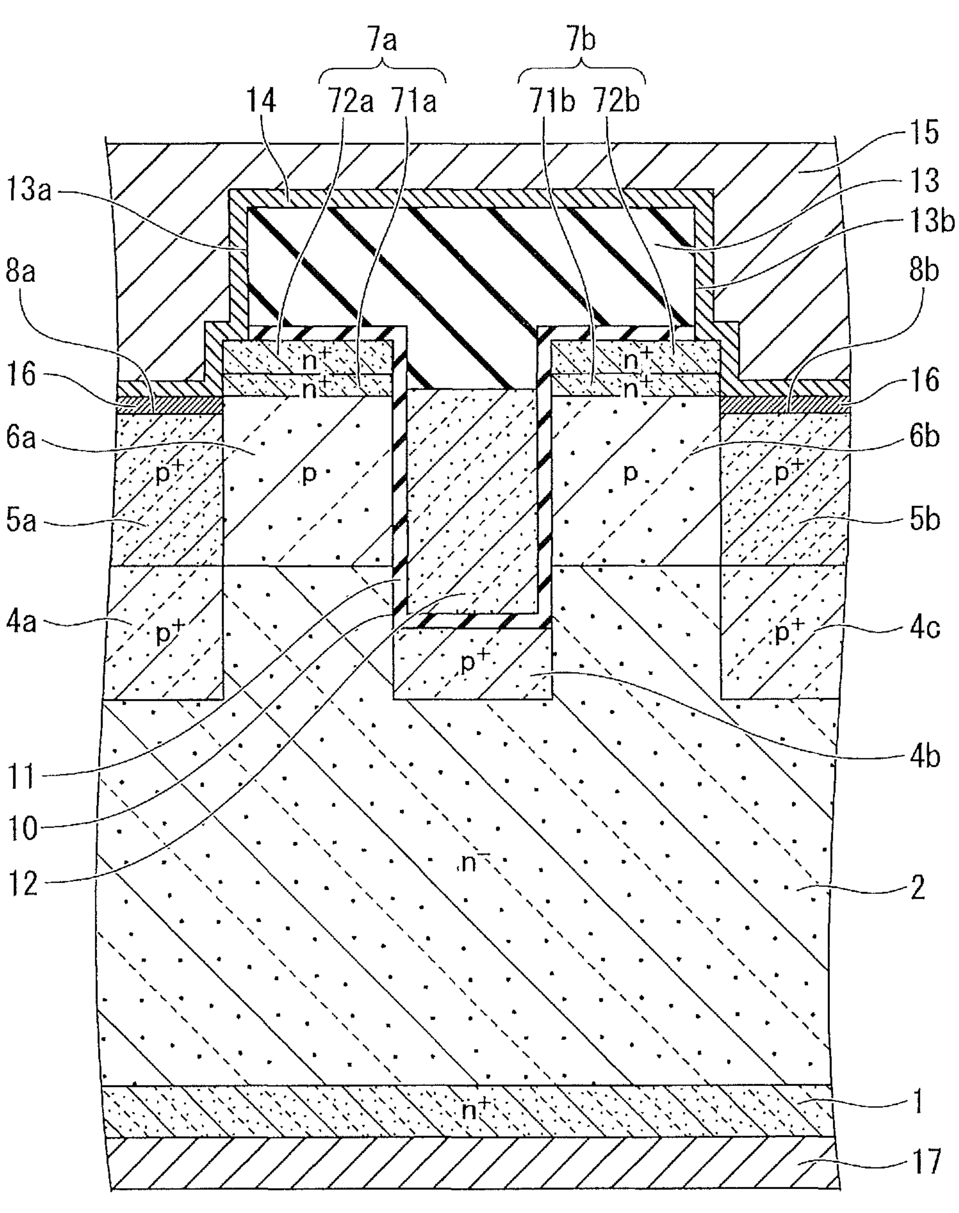
FIG. 22 is a schematic cross-sectional view illustrating an example of a silicon carbide semiconductor device according to a fifth embodiment.

A silicon carbide semiconductor device according to a fifth embodiment differs from the silicon carbide semiconductor device according to the first embodiment illustrated in FIG. 1 in that the $n^+$-type source expansion regions 71*a* and 7*b* including 4H-SiC have a smaller thickness, as illustrated in FIG. 22. The other configurations of the silicon carbide semiconductor device according to the fifth embodiment are substantially the same as those of the silicon carbide semiconductor device according to the first embodiment, and overlapping explanations are not repeated below.

A method of manufacturing the silicon carbide semiconductor device according to the fifth embodiment does not include the step of the ion implantation for forming the source expansion region 71 on the top surface side of the base region 6 illustrated in FIG. 5. Instead, the manufacturing method according to the fifth embodiment includes a step of selectively implanting n-type impurity ions such as nitrogen (N) so as to selectively form the $n^+$-type source contact region 72 on the top surface side of the base region 6. The ion implantation inevitably causes a concentration gradient on the deeper side, providing a region having a lower impurity concentration in contact with the source contact region 72 on the deeper side accordingly. The region with the lower impurity concentration turns to the 4H-SiC structure after the annealing, and the part including 4H-SiC is thus used as the source expansion region 71. The other steps of the method of manufacturing the silicon carbide semiconductor device according to the fifth embodiment are substantially the same as those of the method of manufacturing the silicon carbide semiconductor device according to the first embodiment, and overlapping explanations are not repeated below.

The configuration of the silicon carbide semiconductor device according to the fifth embodiment, which includes the source expansion regions 71*a* and 71*b* having a smaller thickness, can also lead the source contact regions 72*a* and 72*b* including 3C-SiC to be in ohmic contact with the source electrode (14, 15, 16) without the silicide layer 16 interposed, and can further avoid a leakage defect since the base contact regions 5*a* and 5*b* including 4H-SiC are not in contact with the source contact regions 72*a* and 72*b* including 3C-SiC, as in the case of the silicon carbide semiconductor device according to the first embodiment.

Other Embodiments

As described above, the invention has been described according to the first to fifth embodiments, but it should not be understood that the description and drawings implementing a portion of this disclosure limit the invention. Various alternative embodiments of the present invention, examples, and operational techniques will be apparent to those skilled in the art from this disclosure.

For example, while the first to fifth embodiments have been illustrated above with the case of using the MOSFET as the semiconductor device, the present invention can also be applied to an insulated gate bipolar transistor (IGBT) having a structure provided with a $p^+$-type collector region instead of the $n^+$-type drain region 1. The present invention can further be applied to a reverse-conducting insulated gate bipolar transistor (RC-IGBT) or a reverse-blocking insulated gate bipolar transistor (RB-IGBT), instead of the simple IGBT.

In addition, the respective configurations disclosed in the first to fifth embodiments can be combined together as appropriate without contradiction with each other. For example, the silicon carbide semiconductor device according to the second embodiment may have a configuration in which the contact trenches 8*a* and 8*b* have a deeper bottom surface than the source expansion regions 71*a* and 7*b*, as in the case of the silicon carbide semiconductor device according to the third embodiment.

Further, the silicon carbide semiconductor device according to the second embodiment may have a configuration in which the $n^+$-type source regions 7*a* and 7*b* only include the $n^+$-type source contact regions 72*a* and 7*b* without the $n^+$-type source expansion regions 71*a* and 71*b* included, as in the case of the silicon carbide semiconductor device according to the fifth embodiment.

As described above, the invention includes various embodiments of the present invention and the like not described herein. Therefore, the scope of the present invention is defined only by the technical features specifying the present invention, which are prescribed by claims, the words and terms in the claims shall be reasonably construed from the subject matters recited in the present specification.

What is claimed is:

1. A silicon carbide semiconductor device comprising:

a drift layer of a first conductivity-type including silicon carbide;

a base region of a second conductivity-type including silicon carbide provided on a top surface side of the drift layer;

a source contact region of the first conductivity-type including silicon carbide having a 3C-structure provided on a top surface side of the base region;

a gate insulating film deposited inside a gate trench penetrating the source contact region and the base region;

a gate electrode buried inside the gate trench with the gate insulating film interposed;

a main electrode buried inside a contact trench provided separately from the gate trench so as to be in contact with at least a side surface of the source contact region; and a base contact region of the second conductivity-type including silicon carbide having a 4H-structure and having a higher impurity concentration than the base region so as to be in contact with a bottom surface of the contact trench, wherein the bottom surface of the contact trench is located at a position deeper than a bottom surface of the source contact region.

2. The silicon carbide semiconductor device of claim 1, wherein the main electrode is in contact with a top surface and the side surface of the source contact region.

3. The silicon carbide semiconductor device of claim 1, wherein the main electrode is not in contact with a top surface of the source contact region but is in contact with the side surface of the source contact region.

4. The silicon carbide semiconductor device of claim 1, further comprising a source expansion region of the first conductivity-type including silicon carbide having a 4H-structure so as to be in contact with the bottom surface of the source contact region.

5. The silicon carbide semiconductor device of claim 4, wherein:

the bottom surface of the contact trench is located at a position shallower than a bottom surface of the source expansion region; and a side surface of the contact trench is in contact with the source expansion region.

6. The silicon carbide semiconductor device of claim 4, wherein the source expansion region has a lower impurity concentration than the source contact region.

7. The silicon carbide semiconductor device of claim 4, wherein the source expansion region has an impurity concentration common to that of the source contact region.

8. The silicon carbide semiconductor device of claim 1, wherein a top surface of the gate electrode is located at a position deeper than the bottom surface of the source contact region.

9. The silicon carbide semiconductor device of claim 1, wherein a bottom surface of the base contact region is located at a position either conforming to or shallower than a bottom surface of the base region.

10. The silicon carbide semiconductor device of claim 1, wherein the main electrode includes a silicide layer in contact with a top surface of the base contact region.

11. The silicon carbide semiconductor device of claim 1, wherein a proportion of the 3C-structure included in the source contact region is in a range of 10% or higher and 100% or lower.

12. The silicon carbide semiconductor device of claim 1, wherein the source contact region includes phosphorus or arsenic as impurity ions.

13. The silicon carbide semiconductor device of claim 1, wherein the source contact region has an impurity concentration in a range of $1\times10^{20}/cm^{-3}$ or higher and $1\times10^{22}/cm^{-3}$ or lower.

14. The silicon carbide semiconductor device of claim 4, wherein the source expansion region has an impurity concentration in a range of $1\times10^{16}/cm^{-3}$ or higher and $1\times10^{20}/cm^{-3}$ or lower.

15. The silicon carbide semiconductor device of claim 4, wherein the source expansion region includes nitrogen or phosphorus as impurities.

16. The silicon carbide semiconductor device of claim 1, wherein the base contact region has an impurity concentration in a range of $1\times10^{19}/cm^{-3}$ or higher and $1\times10^{21}/cm^{-3}$ or lower.

17. The silicon carbide semiconductor device of claim 1, wherein the base contact region includes aluminum as impurities.

18. A method of manufacturing a silicon carbide semiconductor device, the method comprising:

forming a base region of a second conductivity-type including silicon carbide on a top surface side of a drift layer of a first conductivity-type including silicon carbide;

forming a source contact region of the first conductivity-type including silicon carbide having a 3C-structure on a top surface side of the base region;

forming a gate trench so as to penetrate the source contact region and the base region;

depositing a gate electrode inside the gate trench with a gate insulating film interposed;

forming a contact trench separately from the gate trench so as to penetrate the source contact region;

depositing a main electrode inside the contact trench so as to be in contact with at least a side surface of the source contact region; and forming a base contact region of the second conductivity-type including silicon carbide having a 4H-structure and having a higher impurity concentration than the base region so as to be in contact with a bottom surface of the contact trench, wherein the contact trench is formed to have the bottom surface located at a position deeper than a bottom surface of the source contact region.

19. The method of manufacturing the silicon carbide semiconductor device of claim 18, wherein the forming the contact trench includes a step of selectively removing a part of the source contact region while using a mask common to that used during ion implantation for forming the base contact region.

20. The method of manufacturing the silicon carbide semiconductor device of claim 18, further comprising:

forming an interlayer insulating film on a top surface of the gate electrode; and forming a contact hole in the interlayer insulating film, wherein the forming the contact trench includes a step of selectively removing a part of the source contact region while using the interlayer insulating film provided with the contact hole as a mask.

* * * * *